US012707845B2

(12) United States Patent
Cheng et al.

(10) Patent No.: US 12,707,845 B2
(45) Date of Patent: Aug. 11, 2026

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yudiao Cheng, Beijing (CN); Lili Du, Beijing (CN); Ni Yang, Beijing (CN); Zhuoran Yan, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 547 days.

(21) Appl. No.: 18/037,427

(22) PCT Filed: Jan. 20, 2022

(86) PCT No.: PCT/CN2022/072979

§ 371 (c)(1),
(2) Date: May 17, 2023

(87) PCT Pub. No.: WO2023/137663

PCT Pub. Date: Jul. 27, 2023

(65) Prior Publication Data

US 2024/0397780 A1 Nov. 28, 2024

(51) Int. Cl.
*H10K 59/35* (2023.01)
*H10K 59/121* (2023.01)
(Continued)

(52) U.S. Cl.
CPC ....... *H10K 59/351* (2023.02); *H10K 59/1213* (2023.02); *H10K 59/1216* (2023.02); *H10K 59/131* (2023.02); *H10K 59/65* (2023.02)

(58) Field of Classification Search
CPC ............. H10K 59/351; H10K 59/1213; H10K 59/1216; H10K 59/131; H10K 59/65; H10K 59/00; H10K 59/121; H10K 59/353
See application file for complete search history.

(56) References Cited

U.S. PATENT DOCUMENTS

2021/0359054 A1 11/2021 Gao et al.
2022/0069047 A1* 3/2022 Yang .................... H10K 59/131
(Continued)

FOREIGN PATENT DOCUMENTS

CN 108735790 A 11/2018
CN 109616481 A 4/2019
(Continued)

OTHER PUBLICATIONS

Chang Jinming et al., "An overview of patented technologies for narrow bezel technology in full-screen phones", HeNan Science and Technology, 2020. English translation included.
(Continued)

*Primary Examiner* — Steven B Gauthier
*Assistant Examiner* — Alvin L Lee
(74) *Attorney, Agent, or Firm* — LEASON ELLIS LLP

(57) ABSTRACT

A display substrate and a display device are provided, the display substrate includes a first display region and a second display region; the first display region includes a first sub-region, which includes first red sub-pixels, first green sub-pixels and first blue sub-pixels; the second display region includes a first circuit region, a second circuit region, and a third circuit region; first light-emitting devices of the first red sub-pixels are electrically connected to the red pixel driving circuits in the second circuit region respectively through first transparent wires, first light-emitting devices of the first green sub-pixels are electrically connected to the first green pixel driving circuits in the first circuit region respectively through second transparent wires, and first light-emitting devices of the first blue sub-pixels are electrically connected to the first blue pixel driving circuits in the third circuit region respectively through third transparent wires.

19 Claims, 8 Drawing Sheets

(51) Int. Cl.
*H10K 59/131* (2023.01)
*H10K 59/65* (2023.01)

(56) References Cited

U.S. PATENT DOCUMENTS

| | | | | |
|---|---|---|---|---|
| 2022/0285452 | A1* | 9/2022 | Kang | H10K 59/65 |
| 2022/0293710 | A1 | 9/2022 | Li et al. | |
| 2022/0319411 | A1 | 10/2022 | Cheng et al. | |
| 2023/0050153 | A1* | 2/2023 | Lee | G02B 5/20 |

FOREIGN PATENT DOCUMENTS

| | | | | |
|---|---|---|---|---|
| CN | 110021646 | A | 7/2019 | |
| CN | 110137236 | A | 8/2019 | |
| CN | 111916486 | A | 11/2020 | |
| CN | 113053976 | A | 6/2021 | |
| CN | 214098977 | U | 8/2021 | |
| CN | 113674689 | A | 11/2021 | |
| CN | 114586168 | A | 6/2022 | |
| WO | WO-2023098330 | A1 * | 6/2023 | H10K 59/353 |

OTHER PUBLICATIONS

Anqi Yang, "Designing Display Pixel Layouts for Under-Panel Cameras", IEEE Transactions On Pattern Analysis and Machine Intelligence, vol. 43, No. 7, Jul. 2021, p. 2245-2256.

* cited by examiner

DISPLAY SUBSTRATE AND DISPLAY DEVICE

CROSS-REFERENCE TO RELATED PATENT APPLICATIONS

This application is a U.S. National Phase Entry of International Application No. PCT/CN2022/072979 filed on Jan. 20, 2022. The present application claims priority to and the benefit of the above-identified application and the above-identified application is incorporated by reference herein in its entirety.

TECHNICAL FIELD

Embodiments of the present disclosure relate to a display substrate and a display device.

BACKGROUND

At present, display screens for electronic devices are developing towards larger screens and full screens, so that users can have a better visual experience. Taking electronic products such as mobile phones and tablet computers as examples, because these electronic devices need to be combined with components such as cameras and light sensors, and these components usually occupy the display region of the display screen, it is difficult to achieve a full-screen design for the display screen.

SUMMARY

At least one embodiment of the present disclosure provides a display substrate, the display substrate comprises a display region, the display region comprises a first display region and a second display region on at least one side of the first display region, the first display region is at least partially light-transmissive; the first display region comprises a first sub-region, the first sub-region comprises a plurality of first sub-pixels arranged in an array, and each of the plurality of first sub-pixels comprises a first light-emitting device; the second display region comprises a first circuit region on a side of the first display region, a second circuit region on a side of the first circuit region away from the first display region, and a third circuit region on a side of the second circuit region away from the first display region; the plurality of first sub-pixels comprise a plurality of first red sub-pixels, a plurality of first green sub-pixels and a plurality of first blue sub-pixels; the first circuit region comprises a plurality of first green pixel driving circuits, the second circuit region comprises a plurality of first red pixel driving circuits, and the third circuit region comprises a plurality of first blue pixel driving circuits; and a plurality of first light-emitting devices of the plurality of first red sub-pixels are electrically connected to the plurality of first red pixel driving circuits respectively through a plurality of first transparent wires, a plurality of first light-emitting devices of the plurality of first green sub-pixels are electrically connected to the plurality of first green pixel driving circuits respectively through a plurality of second transparent wires, and a plurality of first light-emitting devices of the plurality of first blue sub-pixels are electrically connected to the plurality of first blue pixel driving circuits respectively through a plurality of third transparent wires.

For example, the display substrate provided by at least one embodiment of the present disclosure further comprises a base substrate, the plurality of first transparent wires are on the base substrate and in a same layer, the plurality of second transparent wires are in a same layer and on a side of the plurality of first transparent wires away from the base substrate, and the plurality of third transparent wires are in a same layer and on a side of the plurality of second transparent wires away from the base substrate.

For example, the display substrate provided by at least one embodiment of the present disclosure further comprises a first planarization layer between the plurality of first transparent wires and the plurality of second transparent wires, and a second planarization layer between the plurality of second transparent wires and the plurality of third transparent wires.

For example, in the display substrate provided by at least one embodiment of the present disclosure, the plurality of first sub-pixels are arranged in a plurality of rows and columns, and form a plurality of pixel units arranged periodically, and each pixel unit of the plurality of pixel units comprises one first red sub-pixel, one first green sub-pixel and one first blue sub-pixel.

For example, in the display substrate provided by at least one embodiment of the present disclosure, in each pixel unit, first light-emitting devices of the first red sub-pixel and the first green sub-pixel are in a same column, and a first light-emitting device of the first blue sub-pixel is in a column adjacent to the same column.

For example, in the display substrate provided by at least one embodiment of the present disclosure, a first transparent wire, a second transparent wire and a third transparent wire, respectively connected to a first light-emitting device of a first red sub-pixel, a first light-emitting device of a first green sub-pixel and a first light-emitting device of a first blue sub-pixel which are in a same pixel unit, at least partially overlap with each other in a direction perpendicular to the base substrate.

For example, in the display substrate provided by at least one embodiment of the present disclosure, the plurality of pixel units are arranged in a plurality of rows and columns, each row of pixel units comprises 18 pixel units, each of the 18 pixel units is electrically connected to a group of transparent wires, and the group of transparent wires comprises one first transparent wire, one second transparent wire and one third transparent wire; and the 18 pixel units comprise 54 first sub-pixels, and the 54 first sub-pixels are electrically connected to 18 groups of transparent wires, respectively.

For example, in the display substrate provided by at least one embodiment of the present disclosure, the plurality of first light-emitting devices of the plurality of first red sub-pixels being electrically connected to the plurality of first red pixel driving circuits respectively through the plurality of first transparent wires comprises: each row of pixel units comprises an (N)th pixel unit and an (N+1)th pixel unit adjacent to each other, and a first red sub-pixel in the (N)th pixel unit is closer to the second circuit region than a first red sub-pixel in the (N+1)th pixel unit; the second circuit region comprises an (N)th first red pixel driving circuit and an (N+1)th first red pixel driving circuit arranged in a same row, and the (N)th first red pixel driving circuit is closer to the first display region than the (N+1)th first red pixel driving circuit; the (N)th first red pixel driving circuit is connected to a first light-emitting device of the first red sub-pixel in the (N)th pixel unit through one first transparent wire, and the (N+1)th first red pixel driving circuit is connected to a first light-emitting device of the first red sub-pixel in the (N+1)th pixel unit through one first transparent wire; and N is a positive integer greater than or equal to 1.

For example, in the display substrate provided by at least one embodiment of the present disclosure, in a direction from an edge of the first display region close to the second display region to a center of the first display region, extension lengths of the plurality of first transparent wires along a column direction increase gradually.

For example, in the display substrate provided by at least one embodiment of the present disclosure, the plurality of first light-emitting devices of the plurality of first green sub-pixels being electrically connected to the plurality of first green pixel driving circuits respectively through the plurality of second transparent wires comprises: each row of pixel units comprises an (N)th pixel unit and an (N+1)th pixel unit adjacent to each other, and a first green sub-pixel in the (N)th pixel unit is closer to the first circuit region than a first green sub-pixel in the (N+1)th pixel unit; the first circuit region comprises an (N)th first green pixel driving circuit and an (N+1)th first green pixel driving circuit arranged in a same row, and the (N)th first green pixel driving circuit is closer to the first display region than the (N+1)th first green pixel driving circuit; the (N)th first green pixel driving circuit is connected to a first light-emitting device of the first green sub-pixel in the (N)th pixel unit through one second transparent wire, and the (N+1)th first green pixel driving circuit is connected to a first light-emitting device of the first green sub-pixel in the (N+1)th pixel unit through one second transparent wire; and N is a positive integer greater than or equal to 1.

For example, in the display substrate provided by at least one embodiment of the present disclosure, the plurality of first light-emitting devices of the plurality of first blue sub-pixels being electrically connected to the plurality of first blue pixel driving circuits respectively through the plurality of third transparent wires comprises: each row of pixel units comprises an (N)th pixel unit and an (N+1)th pixel unit adjacent to each other, and a first blue sub-pixel in the (N)th pixel unit is closer to the third circuit region than a first blue sub-pixel in the (N+1)th pixel unit; the third circuit region comprises an (N)th first blue pixel driving circuit and an (N+1)th first blue pixel driving circuit arranged in a same row, and the (N)th first blue pixel driving circuit is closer to the first display region than the (N+1)th first blue pixel driving circuit; the (N)th first blue pixel driving circuit is connected to a first light-emitting device of the first blue sub-pixel in the (N)th pixel unit through one third transparent wire, and the (N+1)th first blue pixel driving circuit is connected to a first light-emitting device of the first blue sub-pixel in the (N+1)th pixel unit through one third transparent wire; and N is a positive integer greater than or equal to 1.

For example, in the display substrate provided by at least one embodiment of the present disclosure, the first display region is basically square, the first sub-region is basically circular, the first sub-region is in a middle portion of the first display region, and second sub-regions are at four corners of the first display region.

For example, in the display substrate provided by at least one embodiment of the present disclosure, the first display region further comprises a second sub-region at least partially surrounding the first sub-region, the second sub-region comprises a plurality of second sub-pixels, each of the plurality of second sub-pixels comprises a second pixel driving circuit and a second light-emitting device, and the second pixel driving circuit is configured to drive the second light-emitting device; and the second pixel driving circuit is on the base substrate, the second light-emitting device is on a side of the second pixel driving circuit away from the base substrate, and in a direction perpendicular to the base substrate, the second light-emitting device at least partially overlaps with the second pixel driving circuit.

For example, in the display substrate provided by at least one embodiment of the present disclosure, a first light-emitting device of the first red sub-pixel comprises a first red electrode pattern electrically connected to a first red pixel driving circuit, a first light-emitting device of the first green sub-pixel comprises a first green electrode pattern electrically connected to a first green pixel driving circuit, and a first light-emitting device of the first blue sub-pixel comprises a first blue electrode pattern electrically connected to a first blue pixel driving circuit; the plurality of second sub-pixels comprise a second red sub-pixel, a second green sub-pixel and a second blue sub-pixel; in the second red sub-pixel, a second light-emitting device comprises a second red electrode pattern electrically connected to a second pixel driving circuit; in the second green sub-pixel, a second light-emitting device comprises a second green electrode pattern electrically connected to a second pixel driving circuit; in the second blue sub-pixel, a second light-emitting device comprises a second blue electrode pattern electrically connected to a second pixel driving circuit; and an area of the first red electrode pattern is smaller than an area of the second red electrode pattern, an area of the first green electrode pattern is smaller than an area of the second green electrode pattern, and an area of the first blue electrode pattern is smaller than an area of the second blue electrode pattern.

For example, in the display substrate provided by at least one embodiment of the present disclosure, the second display region further comprises a plurality of third sub-pixels, each of the plurality of third sub-pixels comprises a third pixel driving circuit and a third light-emitting device, and the third pixel driving circuit is configured to drive the third light-emitting device; the third pixel driving circuit is on the base substrate, the third light-emitting device is on a side of the third pixel driving circuit away from the base substrate, and in the direction perpendicular to the base substrate, the third light-emitting device at least partially overlaps with the third pixel driving circuit; and in the second display region, the plurality of third pixel region circuits are arranged in a first array.

For example, in the display substrate provided by at least one embodiment of the present disclosure, densities of a plurality of first light-emitting devices, a plurality of second light-emitting devices and a plurality of third light-emitting devices are same.

For example, in the display substrate provided by at least one embodiment of the present disclosure, in the first circuit region of the second display region, the plurality of first green pixel driving circuits are dispersed in the first array, and arranged as a second array with the plurality of third pixel driving circuits; in the second circuit region of the second display region, the plurality of first red pixel driving circuits are dispersed in the first array, and arranged as a third array with the plurality of third pixel driving circuits; and in the third circuit region of the second display region, the plurality of first blue pixel driving circuits are dispersed in the first array, and arranged as a fourth array with the plurality of third pixel driving circuits.

For example, in the display substrate provided by at least one embodiment of the present disclosure, the second array, the third array and the fourth array are basically identical in shape.

For example, in the display substrate provided by at least one embodiment of the present disclosure, in the first circuit region, three third pixel driving circuits are between every two adjacent first green pixel driving circuits in a same row; in the second circuit region, three third pixel driving circuits are between every two adjacent first red pixel driving circuits in a same row; and in the third circuit region, three third pixel driving circuits are between every two adjacent first blue pixel driving circuits in a same row.

For example, in the display substrate provided by at least one embodiment of the present disclosure, the first circuit region further comprises a plurality of first green dummy pixel driving circuits, the second circuit region further comprises a plurality of second red dummy pixel driving circuits, and the third circuit region further comprises a plurality of second blue dummy pixel driving circuits; the plurality of second sub-pixels comprise a plurality of second red sub-pixels, a plurality of second green sub-pixels and a plurality of second blue sub-pixels; the display substrate further comprises a plurality of first dummy transparent wires, a plurality of second dummy transparent wires and a plurality of third dummy transparent wires; the plurality of first dummy transparent wires respectively extend between the plurality of first red dummy pixel driving circuits and the plurality of second red sub-pixels, and the plurality of first dummy transparent wires are electrically connected to the plurality of first red dummy pixel driving circuits, respectively, but not electrically connected to a plurality of second light-emitting devices of the plurality of second red sub-pixels; the plurality of second dummy transparent wires respectively extend between the plurality of first green dummy pixel driving circuits and the plurality of second green sub-pixels, and the plurality of second dummy transparent wires are electrically connected to the plurality of first green dummy pixel driving circuits, respectively, but not electrically connected to a plurality of second light-emitting devices of the plurality of second green sub-pixels; and the plurality of third dummy transparent wires respectively extend between the plurality of first blue dummy pixel driving circuits and the plurality of second blue sub-pixels, and the plurality of third dummy transparent wires are electrically connected to the plurality of first blue dummy pixel driving circuits, respectively, but not electrically connected to a plurality of second light-emitting devices of the plurality of second blue sub-pixels.

For example, in the display substrate provided by at least one embodiment of the present disclosure, the plurality of first dummy transparent wires are in a same layer as the plurality of first transparent wires, the plurality of second dummy transparent wires are in a same layer as the plurality of second transparent wires, and the plurality of third dummy transparent wires are in a same layer as the plurality of third transparent wires.

For example, in the display substrate provided by at least one embodiment of the present disclosure, each of shapes of the first circuit region, the second circuit region and the third circuit region is basically a rectangle, and each of shapes of the second array, the third array and the fourth array is basically a semicircle; and the semicircle comprises an arc edge and a straight-line edge, and the arc edge is closer to the first display region than the straight-line edge.

For example, in the display substrate provided by at least one embodiment of the present disclosure, the plurality of first green dummy pixel driving circuits, the plurality of second red dummy pixel driving circuits and the plurality of second blue dummy pixel driving circuits are respectively at two corners of a rectangle, except the semicircle, of the first circuit region, the second circuit region and the third circuit region.

For example, in the display substrate provided by at least one embodiment of the present disclosure, materials of the plurality of first transparent wires, the plurality of second transparent wires and the plurality of third transparent wires comprise transparent metal oxides.

For example, in the display substrate provided by at least one embodiment of the present disclosure, the display region comprises two second display regions, and the two second display regions are respectively on opposite sides of the first display region, and are symmetrical with respect to the first display region.

For example, in the display substrate provided by at least one embodiment of the present disclosure, the display region further comprises a third display region at least partially surrounding the first display region and the second display region, the third display region comprises a plurality of fourth sub-pixels, each of the plurality of fourth sub-pixels comprises a fourth pixel driving circuit and a fourth light-emitting device, and the fourth pixel driving circuit is configured to drive the fourth light-emitting device; the fourth pixel driving circuit is on the base substrate, the fourth light-emitting device is on a side of the fourth pixel driving circuit away from the base substrate, and in a direction perpendicular to the base substrate, the fourth light-emitting device at least partially overlaps with the fourth pixel driving circuit; and the third display region further comprises a plurality of second dummy pixel driving circuits, and the plurality of second dummy pixel driving circuits are dispersed in a plurality of fourth pixel driving circuits.

For example, in the display substrate provided by at least one embodiment of the present disclosure, the plurality of second dummy pixel driving circuits are arranged in a plurality of columns, and three columns of fourth pixel driving circuits are between every two adjacent columns of second dummy pixel driving circuits.

For example, in the display substrate provided by at least one embodiment of the present disclosure, the first red pixel driving circuit comprises a thin film transistor and a storage capacitor, and a first light-emitting device of the first red sub-pixel comprises a first red electrode pattern electrically connected to the first red pixel driving circuit; the thin film transistor comprises an active layer, a gate electrode, and source-drain electrodes; the storage capacitor comprises a first capacitor plate and a second capacitor plate; the active layer is on the base substrate; the gate electrode and the first capacitive plate are in a same layer and on a side of the active layer away from the base substrate; the second capacitor plate is on a side of the gate electrode and the first capacitor plate away from the base substrate; the source-drain electrodes are on a side of the second capacitor plate away from the base substrate; and in a direction perpendicular to the base substrate, the plurality of first transparent wires, the plurality of second transparent wires and the plurality of third transparent wires are between the source-drain electrodes and the first red electrode pattern.

For example, the display substrate provided by at least one embodiment of the present disclosure further comprises: a third planarization layer on a side of the first red pixel driving circuit away from the base substrate, materials of the first planarization layer, the second planarization layer and the third planarization layer are same.

At least one embodiment of the present disclosure further provides a display device, the display device comprises the display substrate provided by the embodiments of the present disclosure and a sensor, the sensor is on a non-display side of the display substrate, an orthographic projection of the sensor on the base substrate at least partially overlaps with the first display region, and the sensor is configured to receive light from a display side of the display substrate.

BRIEF DESCRIPTION OF THE DRAWINGS

In order to clearly illustrate the technical solutions of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

In order to realize the full-screen design of the display screen, in some embodiments, part of the display region for installing components such as sensors (for example, image sensors and infrared sensors) may be designed as a light-transmissive display region, so that the light-transmissive display region can facilitate the installation of components such as sensors while realizing the display function.

Figure 1A:
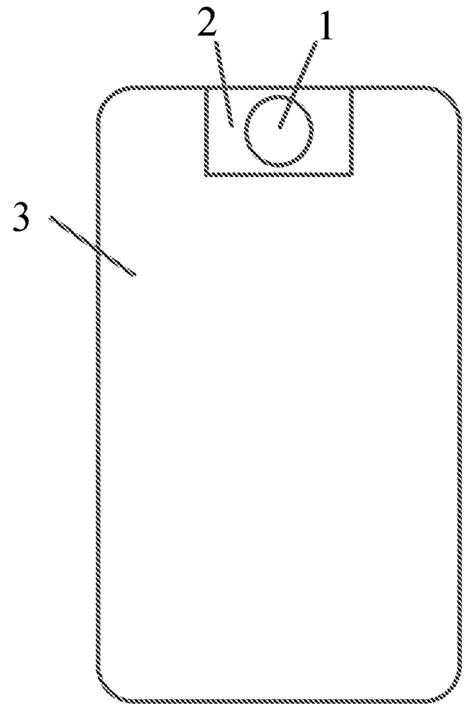
FIG. 1A is a schematic plan view of a display substrate.
Figure 1B:
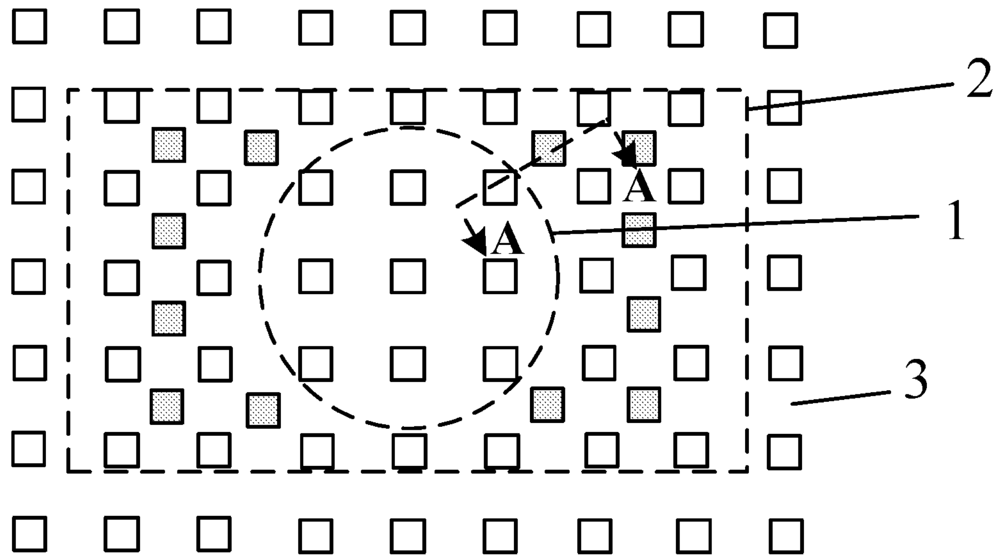
FIG. 1B is a schematic partially enlarged view of the display substrate in FIG. 1A.
Figure 2:
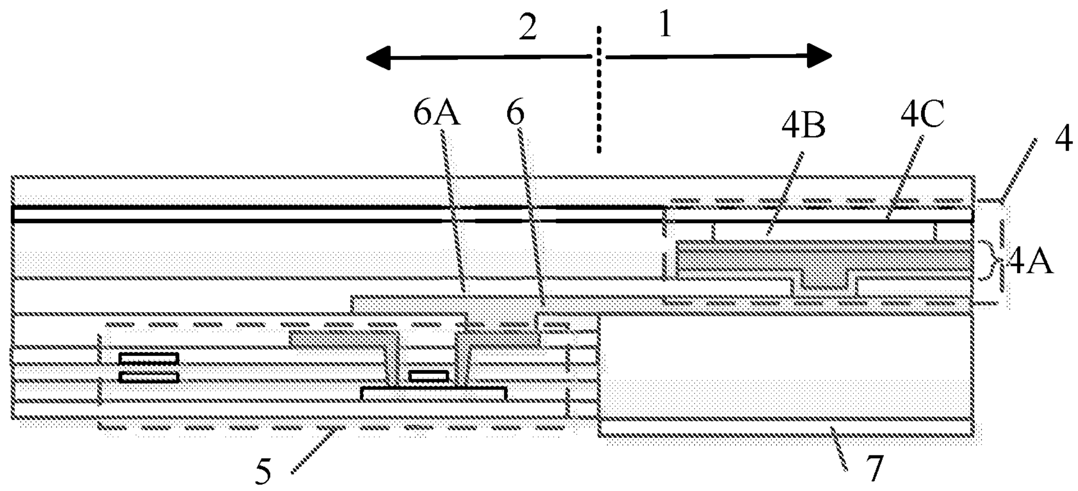
FIG. 2 is a schematic cross-sectional view of the display substrate in FIG. 1B along a line A-A.

For example, FIG. 1A illustrates a schematic plan view of a display substrate, FIG. 1B is a schematic partially enlarged view of the display substrate illustrated in FIG. 1A, and FIG. 2 illustrates a schematic cross-sectional view of the display substrate in FIG. 1B along a line A-A. As illustrated in FIG. 1A, FIG. 1B and FIG. 2, the display region of the display substrate includes a light-transmissive display region 1, a peripheral display region 2 and a main body display region 3.

For example, the main body display region 3 is a main display region, the main body display region 3 includes a plurality of sub-pixels arranged in an array, and each sub-pixel includes a light-emitting device and a pixel driving circuit for driving the light-emitting device. The light-transmissive display region 1 can allow light incident from a display side of the display substrate to pass through the display substrate and reach a backside of the display substrate, so as to be used for normal operation of components such as sensors on the backside of the display substrate. The light-transmissive display region 1 and the peripheral display region 2 also include a plurality of sub-pixels for display. However, because the pixel driving circuit of the sub-pixel is generally opaque, in order to ensure the light transmittance of the light-transmissive display region 1, the pixel driving circuit of the sub-pixel (for example, as illustrated by a frame in the light-transmissive display region 1 in FIG. 1B) in the light-transmissive display region 1 can be provided in the peripheral display region 2, as illustrated by a gray frame in the peripheral display region 2.

As illustrated in FIG. 2, a light-emitting device 4 of a sub-pixel in the light-transmissive display region 1 includes an anode 4A, a cathode 4C, and a light-emitting layer 4B between the anode 4A and the cathode 4C. The anode 4A is electrically connected to a pixel driving circuit 5 in the peripheral display region 2 through a transparent wire 6 (such as an ITO wire), so that the pixel driving circuit 5 in the peripheral display region 2 can be used to drive the light-emitting device 4 in the light-transmissive display region 1. Because the transparent wire 6 has a high light transmittance, it can ensure that the light-transmissive display region 1 also has a high light transmittance. Thus, the component such as a sensor 7 on the backside of the display substrate can receive the light transmitted from the display side of the display substrate through the light-transmissive display region 1 to perform normal operation.

However, the inventor(s) of the present disclosure found in the research that due to different light-emitting efficiencies of sub-pixels of different colors, the turn-on time (that is, the time from providing a driving signal to the time when the light-emitting device emits light) of the light-emitting device 4 of different sub-pixels is different, and even some sub-pixels cannot be turned on at a low gray level, thus affecting the display effect of the display substrate, such as causing poor brightness and image uniformity of the light-transmissive display region 1, which reduces user experience.

At least one embodiment of the present disclosure provides a display substrate and a display device. The display substrate includes a display region, the display region includes a first display region and a second display region on at least one side of the first display region, and the first display region is at least partially light-transmissive; the first display region includes a first sub-region, the first sub-region includes a plurality of first sub-pixels arranged in an array, and each of the plurality of first sub-pixels includes a first light-emitting device; the second display region includes a first circuit region on a side of the first display region, a second circuit region on a side of the first circuit region away from the first display region, and a third circuit region on a side of the second circuit region away from the first display region; the plurality of first sub-pixels include a plurality of first red sub-pixels, a plurality of first green sub-pixels and a plurality of first blue sub-pixels; the first circuit region includes a plurality of first green pixel driving circuits, the second circuit region includes a plurality of first red pixel driving circuits, and the third circuit region includes a plurality of first blue pixel driving circuits; and a plurality of first light-emitting devices of the plurality of first red sub-pixels are electrically connected to the plurality of first red pixel driving circuits respectively through a plurality of first transparent wires, a plurality of first light-emitting devices of the plurality of first green sub-pixels are electrically connected to the plurality of first green pixel driving circuits respectively through a plurality of second transparent wires, and a plurality of first light-emitting devices of the plurality of first blue sub-pixels are electrically connected to the plurality of first blue pixel driving circuits respectively through a plurality of third transparent wires.

In the above-mentioned display substrate provided by the embodiments of the present disclosure, due to the different light-emitting efficiencies of sub-pixels of different colors, the turn-on time of sub-pixels of different colors is different, specifically, the turn-on time T(G) of a green sub-pixel>the turn-on time T(R) of a red sub-pixel>the turn-on time T(B) of a blue sub-pixel. In order to ensure that a middle region of the first display region, that is, a first sub-region is normally turned on at a low gray level, by setting the distance between the first green pixel driving circuit and the first display region to be relatively close, and setting the distance between the first blue pixel driving circuit and the first display region to be relatively far, the magnitude relationship of parasitic capacitances of transparent wires connected to the light-emitting devices of the sub-pixels of different colors is: the parasitic capacitance C(G) of a transparent wire connected to a light-emitting device of the green sub-pixel<the parasitic capacitance C(R) of a transparent wire connected to a light-emitting device of the red sub-pixel<the parasitic capacitance C(B) of a transparent wire connected to a light-emitting device of the blue sub-pixel. In this way, the turn-on time of sub-pixels of different colors can be balanced, thereby solving the problem that the first display region cannot be turned on at a low gray level, making the turn-on time of sub-pixels of different colors basically the same, and improving the display quality of the first display region at a low gray level.

In the following, the display substrate and the display device provided by the embodiments of the present disclosure will be described in detail through several specific embodiments.

Figure 3:
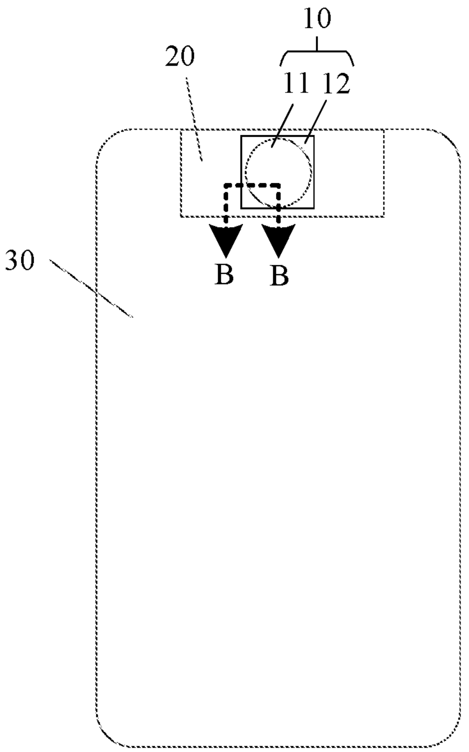
FIG. 3 is a schematic plan view of a display substrate provided by at least one embodiment of the present disclosure.
Figure 4:
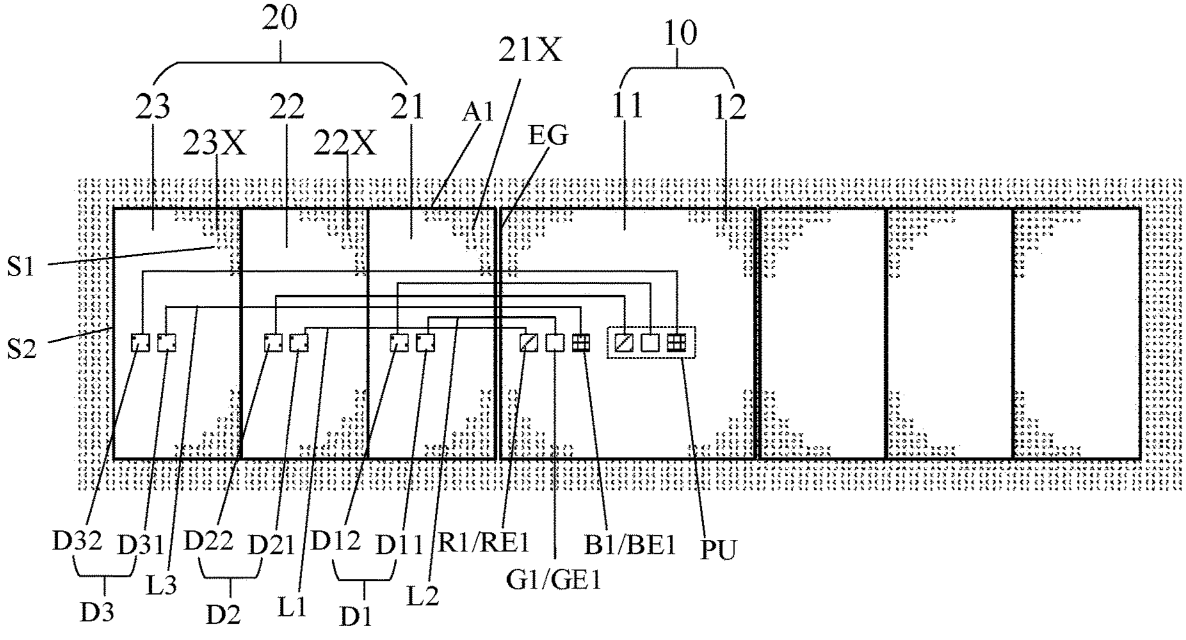
FIG. 4 is a schematic partially enlarged view of the display substrate in FIG. 3.

For example, FIG. 3 illustrates a schematic plan view of a display substrate provided by at least one embodiment of the present disclosure, and FIG. 4 is a schematic partially enlarged view of the display substrate illustrated in FIG. 3. As illustrated in FIG. 3 and FIG. 4, the display substrate includes a display region, the display region includes a first display region 10 and a second display region 20 on at least one side of the first display region, and the first display region 10 is at least partially light-transmissive. Therefore, the light on a display side of the display substrate can at least partially pass through the first display region 10 and reach a non-display side of the display substrate, so as to be used for photosensitive devices, such as cameras, infrared sensors, or other sensors, on the non-display side of the display substrate to work.

For example, the first display region 10 includes a first sub-region 11, and the first sub-region 11 is in the middle of the first display region 10 and is a main light-transmissive region. For example, the first sub-region 11 includes a plurality of first sub-pixels arranged in an array, and the plurality of first sub-pixels include a plurality of first red sub-pixels R1, a plurality of first green sub-pixels G1 and a plurality of first blue sub-pixels B1. Each of the plurality of first sub-pixels includes a first light-emitting device, for example, the first red sub-pixel R1 includes a first light-emitting device RE1, the first green sub-pixel G1 includes a first light-emitting device GE1, and the first blue sub-pixel B1 includes a first light-emitting device BE1.

As illustrated in FIG. 4, the second display region 20 includes a first circuit region 21 on a side of the first display region 10, a second circuit region 22 on a side of the first circuit region 21 away from the first display region 10, and a third circuit region 23 on a side of the second circuit region 22 away from the first display region 10. The first circuit region 21 includes a plurality of first green pixel driving circuits D1, such as the first green pixel driving circuits D11 and D12, etc., illustrated in the figure; the second circuit region 22 includes a plurality of first red pixel driving circuits D2, such as the first red pixel driving circuits D21 and D22, etc., illustrated in the figure; and the third circuit region 23 includes a plurality of first blue pixel driving circuits D3, such as the first blue pixel driving circuits D31 and D32, etc., illustrated in the figure.

As illustrated in FIG. 4, a plurality of first light-emitting devices RE1 of the plurality of first red sub-pixels R1 are electrically connected to the plurality of first red pixel driving circuits D2 respectively through a plurality of first transparent wires L1; a plurality of first light-emitting devices GE1 of the plurality of first green sub-pixels G1 are electrically connected to the plurality of first green pixel driving circuits D1 respectively through a plurality of second transparent wires L2; and a plurality of first light-emitting devices BE1 of the plurality of first blue sub-pixels B1 are electrically connected to the plurality of first blue pixel driving circuits D3 respectively through a plurality of third transparent wires L3. Therefore, the first light-emitting devices of the plurality of first sub-pixels in the first sub-region 11 are driven by the pixel driving circuits in the second display region 20 to ensure the light transmittance of the first sub-region 11.

For example, the plurality of first sub-pixels in the first sub-region 11 are arranged in a plurality of rows and columns, and form a plurality of pixel units PU arranged periodically, and each pixel unit PU of the plurality of pixel units PU includes one first red sub-pixel R1, one first green sub-pixel G1 and one first blue sub-pixel B1, that is, each pixel unit PU includes three sub-pixels.

In the embodiments of the present disclosure, in each pixel unit PU, the length of the third transparent wire L3 connected to the blue sub-pixel B1 is the longest, and the length of the second transparent wire L2 connected to the green sub-pixel G1 is the shortest. Therefore, the magnitude relationship of the parasitic capacitances of the transparent wires connected to the light-emitting devices of the sub-pixels of different colors is: the parasitic capacitance C(G) of the transparent wire L2 connected to the light-emitting device GE1 of the green sub-pixel G1<the parasitic capacitance C(R) of the transparent wire L1 connected to the light-emitting device RE1 of the red sub-pixel R1<the parasitic capacitance C(B) of the transparent wire L3 connected to the light-emitting device BE1 of the blue sub-pixel B1, thereby solving the problem that the first display region 10 cannot be turned on at a low gray level, making the turn-on time of the sub-pixels of different colors basically the same, improving the uniformity of the display brightness and the display image, and improving the display quality of the first display region 10 at a low gray level.

Figure 5:
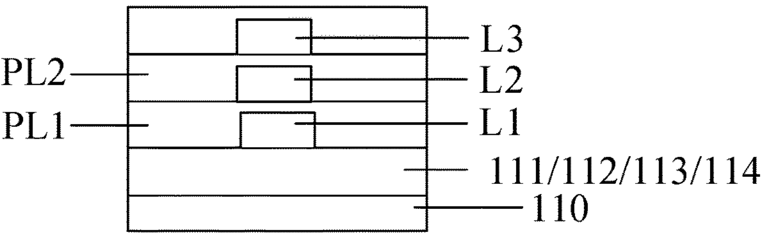
FIG. 5 is a schematic cross-sectional view of a first transparent wire, a second transparent wire, and a third transparent wire in a display substrate provided by at least one embodiment of the present disclosure.

For example, FIG. 5 illustrates a schematic cross-sectional view of the first transparent wire, the second transparent wire and the third transparent wire. In some embodiments, as illustrated in FIG. 5, the display substrate further includes a base substrate 110, the plurality of first transparent wires L1 are on the base substrate 110 and in the same layer, the plurality of second transparent wires L2 are in the same layer and on a side of the plurality of first transparent wires L1 away from the base substrate 110, and the plurality of third transparent wires L3 are in the same layer and on a side of the plurality of second transparent wires L2 away from the base substrate 110.

For example, in some embodiments, as illustrated in FIG. 5, the display substrate further includes a first planarization layer PL1 and a second planarization layer PL2, the first planarization layer PL1 is provided between the plurality of first transparent wires L1 and the plurality of second transparent wires L2, and the second planarization layer PL2 is provided between the plurality of second transparent wires L2 and the plurality of third transparent wires L3. The first planarization layer PL1 and the second planarization layer PL2 can simultaneously play the role of insulation and planarization, so as to ensure that the plane where each transparent wire is located is relatively flat, so as to improve the reliability of the transparent wire.

Therefore, the third transparent wire L3 adopted by the blue sub-pixel B1 is the farthest away from the base substrate 110, and more planarization layers are arranged below the third transparent wire L3, so the arrangement of the third transparent wire L3 is more uniform; the first transparent wire L1 adopted by the red sub-pixel R1 is the shortest away from the base substrate 110; because other pixel driving circuits are formed between the base substrate 110 and each transparent wire, the third transparent wire L3 adopted by the blue sub-pixel B1 has the smallest parasitic capacitance with these pixel driving circuits per unit length, and the first transparent wire L1 adopted by the red sub-pixel R1 has the largest parasitic capacitance with these pixel driving circuits per unit length; in this way, the magnitude of the parasitic capacitance generated by the transparent wire adopted by each color sub-pixel can be further balanced, so that the turn-on time of the sub-pixels of different colors is basically the same, and the display quality of the first display region 10 at a low gray level is improved.

For example, in some embodiments, as illustrated in FIG. 5, a first transparent wire L1, a second transparent wire L2 and a third transparent wire L3, respectively connected to a first light-emitting device RE1 of a first red sub-pixel R1, a first light-emitting device GE1 of a first green sub-pixel G1 and a first light-emitting device BE1 of a first blue sub-pixel B1 which are in the same pixel unit, at least partially overlap with each other in a direction perpendicular to the base substrate (that is, the vertical direction in the figure). Therefore, the space occupied by the first transparent wire L1, the second transparent wire L2 and the third transparent wire L3 adopted by the same pixel unit PU on the base substrate 110 can be reduced.

Figure 6:
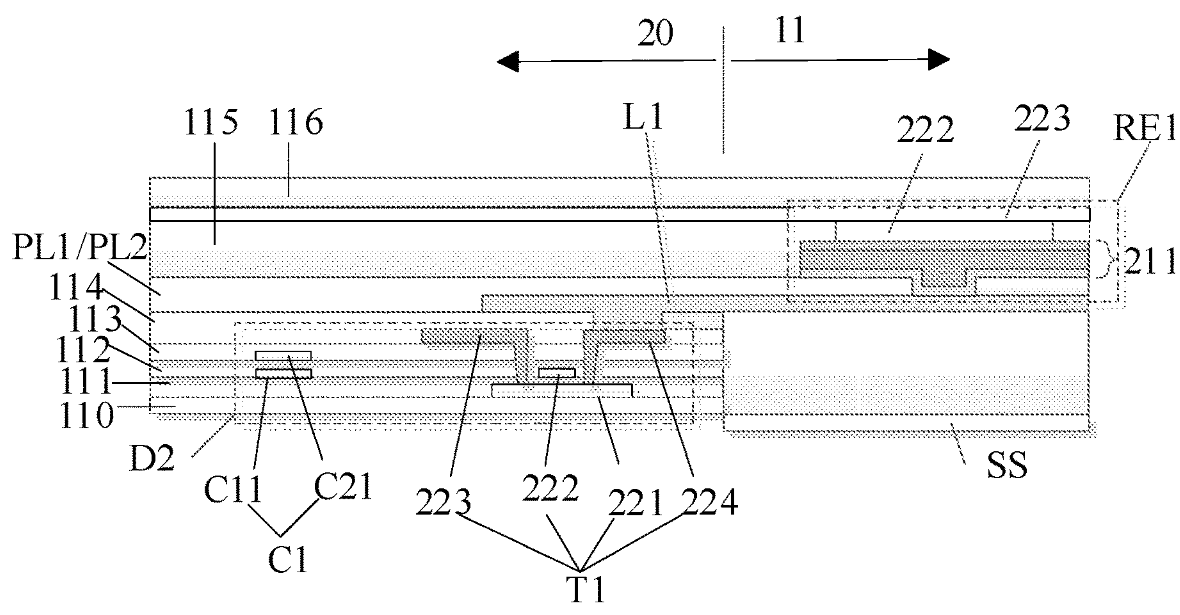
FIG. 6 is a schematic cross-sectional view of a first sub-pixel in a first sub-region in a first display region of a display substrate provided by at least one embodiment of the present disclosure.

For example, FIG. 6 illustrates a schematic cross-sectional view of the display substrate in FIG. 3 along a line B-B, as illustrated in FIG. 6, the first red pixel driving circuit D2 includes structures such as a thin film transistor T1 and a storage capacitor C1, etc. The first light-emitting device RE1 of the first red sub-pixel R1 includes a first red electrode pattern 211 (hereinafter identified as RP1, serving as an anode of the first light-emitting device) electrically connected to the first red pixel driving circuit D2, a second red electrode 213 (serving as a cathode of the first light-emitting device) spaced apart from the first red electrode pattern 211, and a first red light-emitting material layer 222 between the first red electrode pattern 211 and the second red electrode 213. For example, the first red electrode pattern 211 may adopt a single-layer or multi-layer structure, such as a multi-layer structure of Ag/ITO/Ag, etc.

As illustrated in FIG. 6, the thin film transistor T1 includes an active layer 221, a gate electrode 222, and source-drain electrodes 223 and 224; the storage capacitor C1 includes a first capacitor plate C11 and a second capacitor plate C12, and the active layer 221 is on the base substrate 110; the gate electrode 222 and the first capacitor plate C11 are in the same layer and on a side of the active layer 221 away from the base substrate 110, the second capacitor plate C12 is on a side of the gate electrode 222 and the first capacitor plate C11 away from the base substrate 110, and the source-drain electrodes 223 and 224 are on a side of the second capacitor plate C12 away from the base substrate 110. In the direction perpendicular to the base substrate 110, that is, in the vertical direction in the figure, the plurality of first transparent wires L1, the plurality of second transparent wires L2, and the plurality of third transparent wires L3 are provided between the source-drain electrodes 223 and 224 and the first red electrode pattern 211 (that is, the above-mentioned RP1).

For example, as illustrated in FIG. 6, the display substrate further includes a first gate insulating layer 111 on a side of the active layer 221 away from the base substrate 110, a second gate insulating layer 112 on a side of the gate electrode 222 away from the base substrate 110, a interlayer insulating layer 113 on a side of the second capacitor plate C12 away from the base substrate 110, and a third planarization layer 114 on a side of the first red pixel driving circuit away from the base substrate 110. For example, materials of the first planarization layer PL1, the second planarization layer PL2 and the third planarization layer 114 are the same, for example, the materials are organic insulating materials such as polyimide, epoxy resin, or the like.

For example, as illustrated in FIG. 6, the display substrate further includes a pixel defining layer 115 on a side of the first red electrode pattern 211 away from the base substrate 110, and an encapsulation layer 116 on a side of the second red electrode 213 away from the base substrate 110. The pixel defining layer 115 includes a plurality of sub-pixel openings for defining light-emitting regions of the sub-pixels. The encapsulation layer 116 may be a composite encapsulation layer, that is, a stacked layer including at least one organic encapsulation layer and at least one inorganic encapsulation layer.

For example, in some embodiments, the plurality of pixel units PU are arranged in a plurality of rows and columns, each row of pixel units includes 18 pixel units, each of the 18 pixel units is electrically connected to a group of transparent wires, and the group of transparent wires includes one first transparent wire L1, one second transparent wire L2, and one third transparent wire L3. The 18 pixel units include 54 first sub-pixels, that is, 18 first red sub-pixels R1, 18 green sub-pixels G1 and 18 blue sub-pixels B1. In this case, the 54 first sub-pixels are electrically connected to 18 groups of transparent wires, respectively. The 18 groups of transparent wires can be evenly arranged in the region occupied by each row of pixel units.

For example, in some embodiments, as illustrated in FIG. 4, each row of pixel units PU includes an (N)th pixel unit (a pixel unit on the left side of the figure) and an (N+1)th pixel unit (a pixel unit on the right side of the figure) adjacent to each other, and the first red sub-pixel in the (N)th pixel unit is closer to the second circuit region 22 than the first red sub-pixel in the (N+1)th pixel unit; the second circuit region 22 includes an (N)th first red pixel driving circuit D21 and an (N+1)th first red pixel driving circuit D22 arranged in the same row, and the (N)th first red pixel driving circuit D21 is closer to the first display region 10 than the (N+1)th first red pixel driving circuit D22; the (N)th first red pixel driving circuit D21 is connected to the first light-emitting device RE1 of the first red sub-pixel R1 in the (N)th pixel unit through one first transparent wire L1, and the (N+1)th first red pixel driving circuit D22 is connected to the first light-emitting device RE1 of the first red sub-pixel R1 in the (N+1)th pixel unit through one first transparent wire L1; and N is a positive integer greater than or equal to 1. That is, the first light-emitting devices of the first red sub-pixels R1 of each row of pixel units PU and corresponding plurality of first red pixel driving circuits D2 adopt a connection mode of "near to near, far to far".

For example, as illustrated in FIG. 4, in a direction from an edge EG of the first display region 10 close to the second display region 20 to the center of the first display region 10, extension lengths of the plurality of first transparent wires L1 along a column direction (that is, the vertical direction in the figure) increase gradually, for example, increase uniformly, and the extension lengths along a row direction (that is, the horizontal direction in the figure) also increase gradually, for example, increase uniformly.

For example, the first light-emitting devices of the first green sub-pixels G1 of each row of pixel units PU and corresponding plurality of first green pixel driving circuits D1 also adopt a connection mode of "near to near, far to far"; and the first light-emitting devices of the first blue sub-pixels B1 of each row of pixel units PU and corresponding plurality of first blue pixel driving circuits D2 also adopt a connection mode of "near to near, far to far".

For example, as illustrated in FIG. 4, each row of pixel units PU includes an (N)th pixel unit and an (N+1)th pixel unit adjacent to each other, and the first green sub-pixel G1 in the (N)th pixel unit is closer to the first circuit region 21 than the first green sub-pixel G1 in the (N+1)th pixel unit; the first circuit region 21 includes an (N)th first green pixel driving circuit D11 and an (N+1)th first green pixel driving circuit D12 arranged in the same row, and the (N)th first green pixel driving circuit D11 is closer to the first display region 10 than the (N+1)th first green pixel driving circuit D12; the (N)th first green pixel driving circuit is connected to a first light-emitting device GE1 of the first green sub-pixel G1 in the (N)th pixel unit through one second transparent wire L2, and the (N+1)th first green pixel driving circuit D12 is connected to a first light-emitting device GE1 of the first green sub-pixel G1 in the (N+1)th pixel unit through one second transparent wire L2; and N is a positive integer greater than or equal to 1.

For example, as illustrated in FIG. 4, in the direction from the edge EG of the first display region 10 close to the second display region 20 to the center of the first display region 10, extension lengths of the plurality of second transparent wires L2 along the column direction (that is, the vertical direction in the figure) increase gradually, for example, increase uniformly, and the extension lengths of the plurality of second transparent wires L2 along the row direction (that is, the horizontal direction in the figure) also increase gradually, for example, increase uniformly.

For example, as illustrated in FIG. 4, each row of pixel units PU includes an (N)th pixel unit and an (N+1)th pixel unit adjacent to each other, and the first blue sub-pixel B1 in the (N)th pixel unit is closer to the third circuit region 23 than the first blue sub-pixel B1 in the (N+1)th pixel unit; the third circuit region 23 includes an (N)th first blue pixel driving circuit D31 and an (N+1)th first blue pixel driving circuit D32 arranged in the same row, and the (N)th first blue pixel driving circuit D31 is closer to the first display region than the (N+1)th first blue pixel driving circuit D32; the (N)th first blue pixel driving circuit D31 is connected to a first light-emitting device BE1 of the first blue sub-pixel B1 in the (N)th pixel unit through one third transparent wire L3, and the (N+1)th first blue pixel driving circuit D32 is connected to a first light-emitting device BE1 of the first blue sub-pixel B1 in the (N+1)th pixel unit through one third transparent wire L3; and N is a positive integer greater than or equal to 1.

For example, as illustrated in FIG. 4, in the direction from the edge EG of the first display region 10 close to the second display region 20 to the center of the first display region 10, extension lengths of the plurality of third transparent wires L3 along the column direction (that is, the vertical direction in the figure) increase gradually, for example, increase uniformly, and the extension lengths of the plurality of third transparent wires L3 along the row direction (that is, the horizontal direction in the figure) also increase gradually, for example, increase uniformly.

Therefore, in the above-mentioned arrangement of connecting a light-emitting device and a pixel driving circuit with a transparent wire, the light-emitting device and the pixel driving circuit correspond to each other in rows, and there is no cross-row or cross-column connection, so the regularity of the arrangement of the transparent wires can be improved, thereby contributing to the circuit layout in the display substrate.

For example, in some embodiments, as illustrated in FIG. 4, the first display region 10 further includes a second sub-region 12 at least partially surrounding the first sub-region 11. For example, in some examples, as illustrated in FIG. 4, the first display region 10 is basically square, and the first sub-region 11 is basically circular. The first sub-region 11 is in a middle portion of the first display region 10 and is the main light-transmissive region. The second sub-region 12 are at four corners of the first display region 10, for example, the second sub-region 12 may be opaque.

Figure 7:
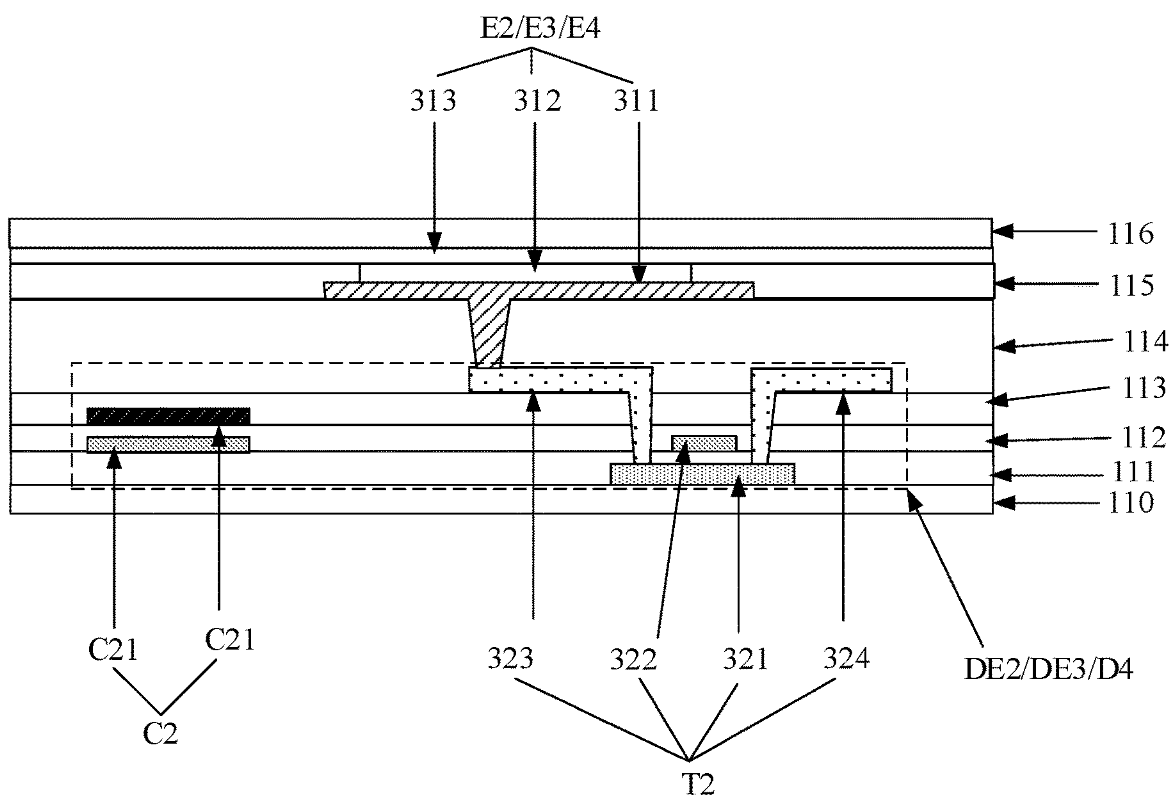
FIG. 7 is a schematic cross-sectional view of a second sub-pixel, a third sub-pixel or a fourth sub-pixel in a display substrate provided by at least one embodiment of the present disclosure.

For example, the second sub-region 12 includes a plurality of second sub-pixels, and FIG. 7 illustrates a schematic cross-sectional view of each second sub-pixel. As illustrated in FIG. 7, each of the plurality of second sub-pixels includes a second pixel driving circuit DE2 and a second light-emitting device E2. For example, the second pixel driving circuit DE2 includes structures such as a thin film transistor T2 and a storage capacitor C2, etc., and the second pixel driving circuit DE2 is configured to drive the second light-emitting device E2. As illustrated in FIG. 7, the second pixel driving circuit DE2 is on the base substrate 110, the second light-emitting device E2 is on a side of the second pixel driving circuit DE2 away from the base substrate 110, and in the direction perpendicular to the base substrate 110, that is, in the vertical direction in FIG. 7, the second light-emitting device E2 at least partially overlaps with the second pixel driving circuit DE2. Therefore, each second sub-pixel adopts a mode of "in-situ driving", the light-emitting device and the pixel driving circuit of the second sub-pixel occupy substantially the same space on the base substrate, and there is no need to use an additional wire to connect the light-emitting device to a pixel driving circuit which is far away from the light-emitting device.

For example, the thin film transistor T2 has basically the same structure as the thin film transistor T1, including an active layer 321, a gate electrode 322, source-drain electrodes 323 and 324, and other structures. The storage capacitor C2 has basically the same structure as the storage capacitor C1, including a first capacitor plate C21 and a second capacitor plate C22. The second light-emitting device E2 includes a second electrode pattern 311 electrically connected to the second pixel driving circuit, a second electrode 313 spaced apart from the second electrode pattern 311, and a second light-emitting material layer 322 between the second electrode pattern 311 and the second electrode 313.

For example, the second display region 20 further includes a plurality of third sub-pixels, for example, the structure of the third sub-pixel is basically the same as the structure of the second sub-pixel. Referring to FIG. 7, each of the plurality of third sub-pixels includes a third pixel driving circuit DE3 and a third light-emitting device E3, and the third pixel driving circuit DE3 is configured to drive the third light-emitting device E3. The third pixel driving circuit DE3 is on the base substrate 110, the third light-emitting device E3 is on a side of the third pixel driving circuit DE3 away from the base substrate 110, and in the direction perpendicular to the base substrate 110, the third light-emitting device E3 at least partially overlaps with the third pixel driving circuit DE3, thus, each third sub-pixel also adopt the mode of "in-situ driving". In the second display region 20, a plurality of third pixel driving circuits are arranged in a first array. For example, the first array may be the rectangular array A1 in FIG. 4.

For example, in some embodiments, densities of the plurality of first light-emitting devices, the plurality of second light-emitting devices and the plurality of third light-emitting devices are the same. That is, arrangement densities of the light-emitting devices for display in the first display region 10 and the second display region 20 are the same, which is beneficial to improve the display uniformity of the display substrate.

For example, in some embodiments, in the first circuit region 21 of the second display region 20, the plurality of first green pixel driving circuits D1 are dispersed in the first array, and arranged as a second array with the plurality of third pixel driving circuits; in the second circuit region 22 of the second display region 20, the plurality of first red pixel driving circuits D2 are dispersed in the first array, and arranged as a third array with the plurality of third pixel driving circuits; and in the third circuit region 23 of the second display region 20, the plurality of first blue pixel driving circuits D3 are dispersed in the first array, and arranged as a fourth array with the plurality of third pixel driving circuits.

For example, the second array, the third array and the fourth array are basically identical in shape. For example, in some examples, as illustrated in FIG. 4, each of shapes of the first circuit region 21, the second circuit region 22 and the third circuit region 23 is basically a rectangle, and each of shapes of the second array, the third array and the fourth array is basically a semicircle. The semicircle includes an arc edge S1 and a straight-line edge S2, and the arc edge S1 is closer to the first display region 10 than the straight-line edge S2. For example, areas of the first circuit region 21, the second circuit region 22 and the third circuit region 23 are basically the same.

Figure 8:
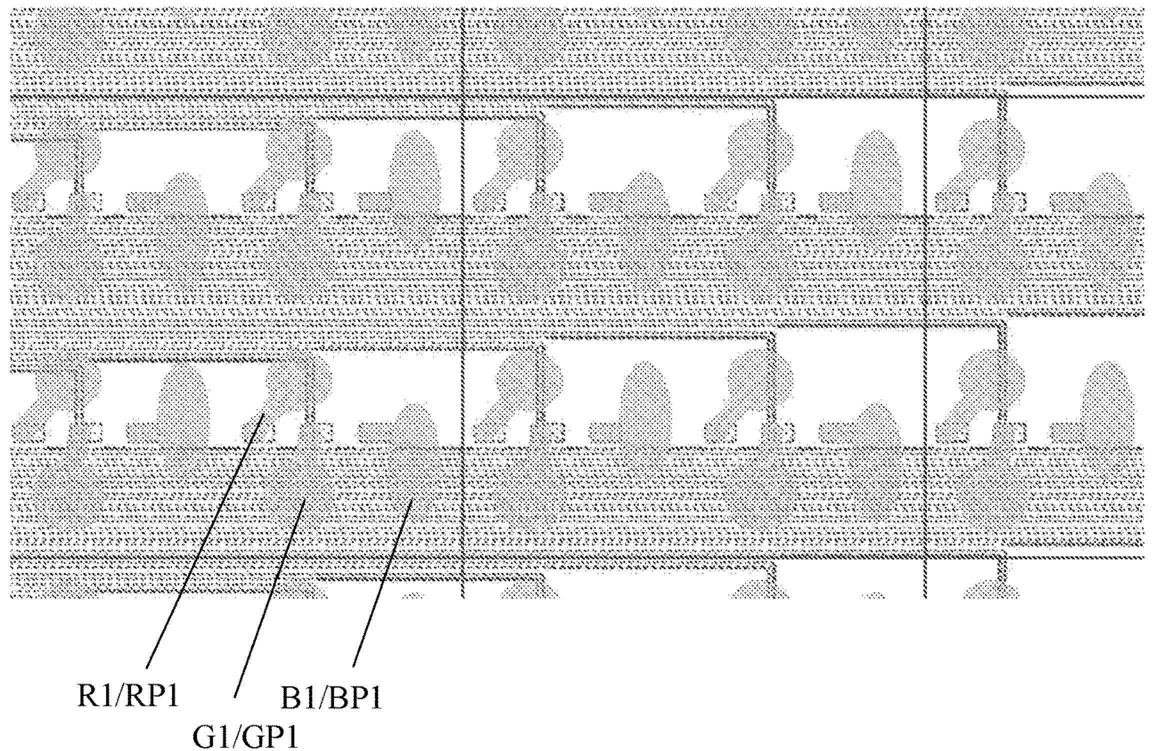
FIG. 8 is a schematic plan view of a first sub-region in a first display region of a display substrate provided by at least one embodiment of the present disclosure.

For example, FIG. 8 illustrates a schematic plan view of part of the first sub-pixels in the first sub-region of the first display region. As illustrated in FIG. 8, in some embodiments, in each pixel unit PU, the first light-emitting device of the first red sub-pixel R1 and the first light-emitting device of the first green sub-pixel G1 are in the same column, and the first light-emitting device of the first blue sub-pixel B1 is in a column adjacent to the same column mentioned above, that is, the first light-emitting device of the blue sub-pixel B1 is in a column different from the first light-emitting devices of the first red sub-pixel R1 and the first green sub-pixel G1.

For example, as illustrated in FIG. 8, the first light-emitting device of the first red sub-pixel R1 includes a first red electrode pattern RP1 electrically connected to the first red pixel driving circuit, the first light-emitting device of the first green sub-pixel G1 includes a first green electrode pattern GP1 electrically connected to the first green pixel driving circuit, and the first light-emitting device of the first blue sub-pixel B1 includes a first blue electrode pattern BP1 electrically connected to the first blue pixel driving circuit. For example, the main body shapes of the first red electrode pattern RP1, the first green electrode pattern GP1 and the first blue electrode pattern BP1 are shapes with arc edges, such as a circle or a semicircle, etc.

Figure 9:
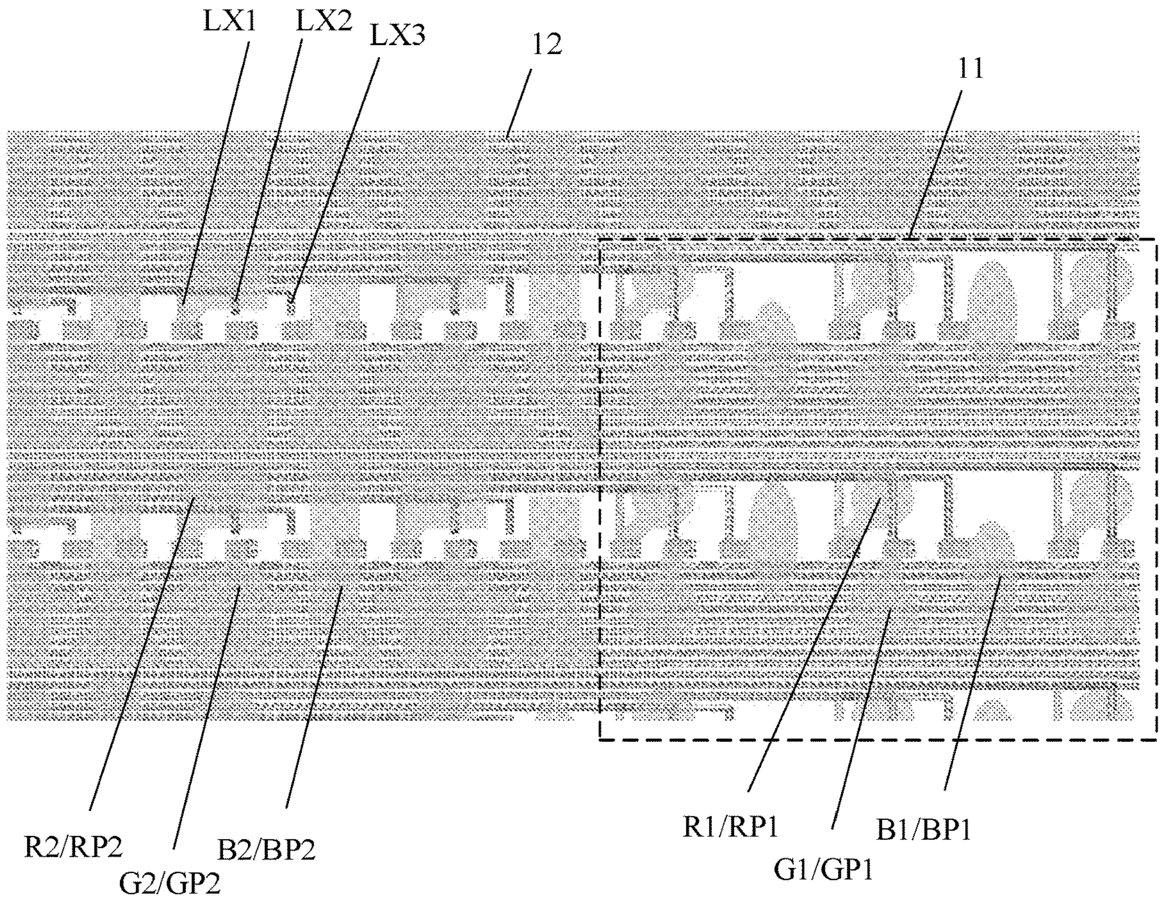
FIG. 9 is a schematic plan view of a first sub-region and a second sub-region in a first display region of a display substrate provided by at least one embodiment of the present disclosure.

For example, FIG. 9 illustrates a schematic plan view of part of the first sub-pixels and part of the second sub-pixels in the first sub-region and the second sub-region of the first display region. As illustrated in FIG. 9, the plurality of second sub-pixels include a second red sub-pixel R2, a second green sub-pixel G2, and a second blue sub-pixel B2. In the second red sub-pixel R2, the second light-emitting device includes a second red electrode pattern RP2 electrically connected to the second pixel driving circuit; in the second green sub-pixel G2, the second light-emitting device includes a second green electrode pattern GP2 electrically connected to the second pixel driving circuit; and in the second blue sub-pixel B2, the second light-emitting device includes a second blue electrode pattern BP2 electrically connected to the second pixel driving circuit. For example, the main body shapes of the second red electrode pattern RP2, the second green electrode pattern GP2 and the second blue electrode pattern BP2 are basically rectangular or in other polygonal shapes.

For example, as illustrated in FIG. 9, the area of the first red electrode pattern RP1 is smaller than the area of the second red electrode pattern RP2, the area of the first green electrode pattern GP1 is smaller than the area of the second green electrode pattern GP2, and the area of the first blue electrode pattern BP1 is smaller than the area of the second blue electrode pattern BP2. Therefore, the first sub-region 11 adopts a "small electrode" design, thereby improving the light transmittance of the first sub-region 11.

Figure 10:
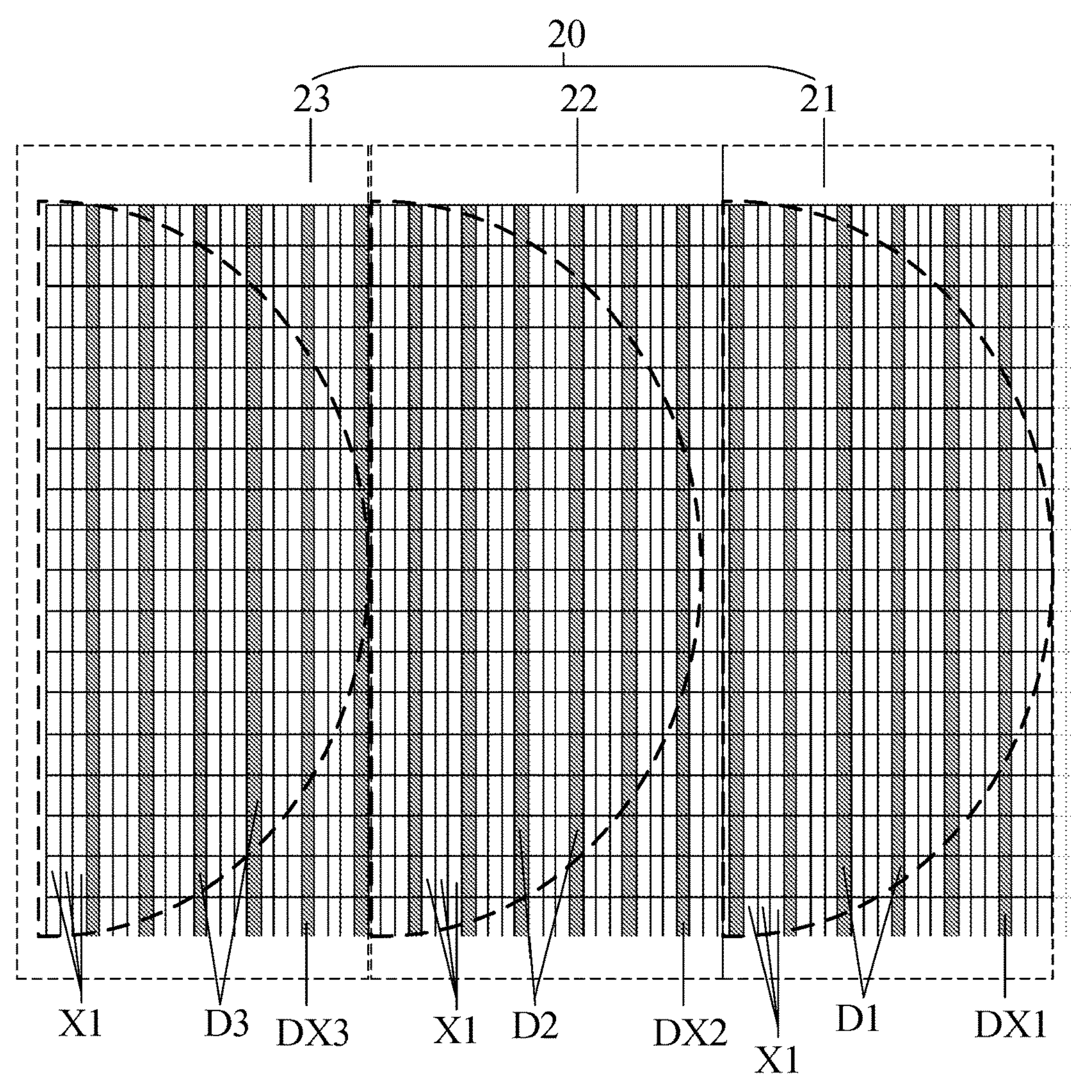
FIG. 10 is a schematic plan view of each pixel driving circuit in a second display region of a display substrate provided by at least one embodiment of the present disclosure.

For example, FIG. 10 illustrates a schematic plan view of various circuit regions in the second display region. In some embodiments, as illustrated in FIG. 10, in the first circuit region 21, three third pixel driving circuits X1 are provided between every two adjacent first green pixel driving circuits D1 in the same row; in the second circuit region 22, three third pixel driving circuits X1 are provided between every two adjacent first red pixel driving circuits D2 in the same row; and in the third circuit region 23, three third pixel driving circuits X1 are provided between every two adjacent first blue pixel driving circuits D3 in the same row. The three third pixel driving circuits X1 are respectively configured to drive the light-emitting devices of the third sub-pixels of three different colors (e.g., red, green and blue).

For example, in some embodiments, as illustrated in FIG. 10, the first circuit region 21 further includes a plurality of first green dummy pixel driving circuits DX1, the second circuit region 22 further includes a plurality of second red dummy pixel driving circuits DX2, and the third circuit region 23 further includes a plurality of second blue dummy pixel driving circuits DX3. In the second sub-region 12, the plurality of second sub-pixels includes a second red sub-pixel R2, a second green sub-pixel G2, and a second blue sub-pixel B2. For example, the display substrate further includes a plurality of first dummy transparent wires LX1, a plurality of second dummy transparent wires LX2 and a plurality of third dummy transparent wires LX3. For example, FIG. 11A schematically illustrates a schematic diagram in which the first light-emitting device of the first sub-pixel in the first sub-region is connected to each pixel driving circuit through a transparent wire, and FIG. 11B illustrates a schematic diagram of the second light-emitting device of the second sub-pixel in the second sub-region connected to a dummy transparent wire, and each dummy pixel driving circuit.

Figure 11A:
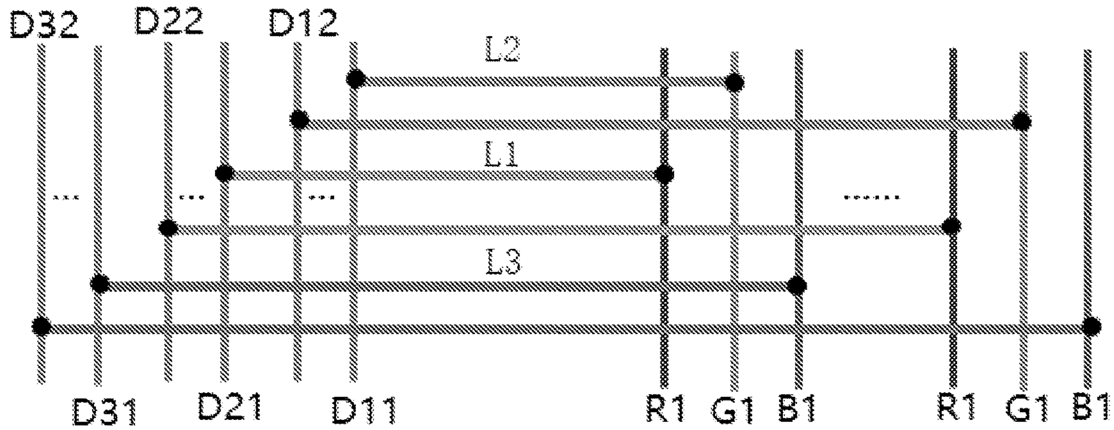
FIG. 11A is a schematic diagram of a first light-emitting device of a first sub-pixel in a first sub-region in a first display region connected to each pixel driving circuit through a transparent wire in a display substrate provided by at least one embodiment of the present disclosure.

Referring to FIG. 9, FIG. 10 and FIG. 11A, a plurality of first transparent wires L1 respectively extend between a plurality of first red pixel driving circuits D2 and a plurality of first red sub-pixels R1, and one end of each of the plurality of first transparent wires L1 is electrically connected to each of the plurality of first red pixel driving circuits D2, and the other end of each of the plurality of first transparent wires L1 is electrically connected to the first light-emitting device of each of the plurality of first red sub-pixel R1, such as the first red electrode pattern RP1; a plurality of second transparent wires L2 respectively extend between a plurality of first green pixel driving circuits D1 and a plurality of first green sub-pixels G1, and one end of each of the plurality of second transparent wires L2 is electrically connected to each of the plurality of first green pixel driving circuits D1, and the other end of each of the plurality of second transparent wires L2 is electrically connected to the first light-emitting device of each of the plurality of first green sub-pixel G1, such as the first green electrode pattern GP1; and a plurality of third transparent wires L3 respectively extend between a plurality of first blue pixel driving circuits D3 and a plurality of first blue sub-pixels B1, and one end of each of the plurality of third transparent wires L3 is electrically connected to each of the plurality of first blue pixel driving circuits D3, and the other end of each of the plurality of third transparent wires L3 is electrically connected to the first light-emitting device of each of the plurality of first blue sub-pixel B1, such as the first blue electrode pattern BP1.

Figure 11B:
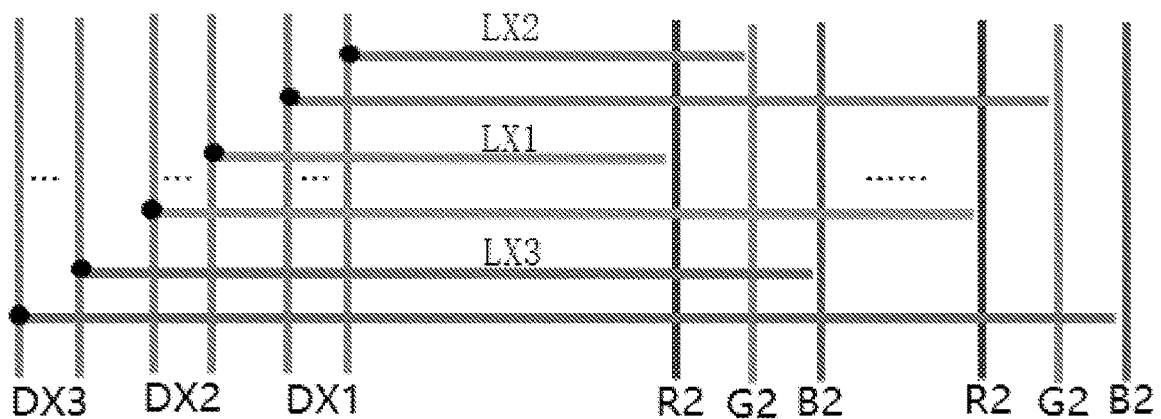
FIG. 11B is a schematic diagram of a second light-emitting device of a second sub-pixel in a second sub-region in a first display region connected to a dummy transparent wire, and each dummy pixel driving circuit in a display substrate provided by at least one embodiment of the present disclosure.

Referring to FIG. 9, FIG. 10 and FIG. 11B, a plurality of first dummy transparent wires LX1 respectively extend between a plurality of first red dummy pixel driving circuits DX2 and a plurality of second red sub-pixels R2, the plurality of first dummy transparent wires LX1 are electrically connected to the plurality of first red dummy pixel driving circuits DX2, respectively, but are not electrically connected to second light-emitting devices of the plurality of second red sub-pixels R2, such as the second red electrode patterns RP2, and this case is illustrated in FIG. 9 and FIG. 11B that there is a space between the first dummy transparent wire LX1 and the second red electrode pattern RP2; a plurality of second dummy transparent wires LX2 respectively extend between a plurality of first green dummy pixel driving circuits DX1 and a plurality of second green sub-pixels G2, the plurality of second dummy transparent wires LX2 are electrically connected to the plurality of first green dummy pixel driving circuits DX1, respectively, but are not electrically connected to second light-emitting devices of the plurality of second green sub-pixels G2, such as the second green electrode patterns GP2, and this case is illustrated in FIG. 9 and FIG. 11B that there is a space between the second dummy transparent wire LX2 and the second green electrode pattern GP2; and a plurality of third dummy transparent wires LX3 respectively extend between a plurality of first blue dummy pixel driving circuits DX3 and a plurality of second blue sub-pixels B2, the plurality of third dummy transparent wires LX3 are electrically connected to the plurality of first blue dummy pixel driving circuits DX3, respectively, but are not electrically connected to second light-emitting devices of the plurality of second blue sub-pixels B2, such as the second blue electrode patterns BP2, and this case is illustrated in FIG. 9 and FIG. 11B that there is a space between the third dummy transparent wire LX3 and the second blue electrode pattern BP2.

In the embodiments of the present disclosure, by the arrangement of each dummy pixel driving circuit and each dummy transparent wire, the etching uniformity of each transparent wire and dummy transparent wire in the second display region 20 can be improved during the manufacturing process. Therefore, the display effect of the first display region 10 and the second display region 20 at the boundary can be uniformly transitioned, and the display uniformity between a plurality of sub-pixel rows can be improved, thereby improving the display effect of the display substrate. In addition, by electrically connecting the dummy transparent wire to the dummy pixel driving circuit but not to the electrode pattern, the floating of the dummy transparent wire can be avoided, thereby avoiding the possible negative impact that may be caused by the floating of the transparent wire.

Figure 12:
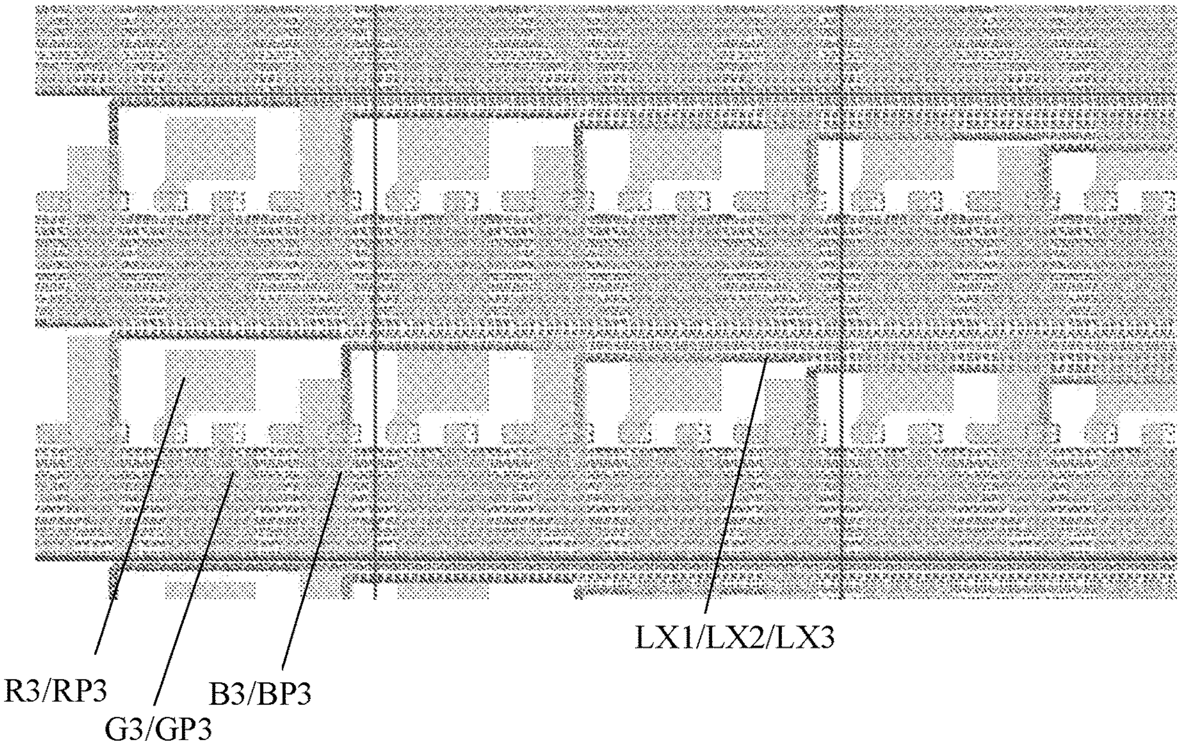
FIG. 12 is a partial plan view of a second display region of a display substrate provided by at least one embodiment of the present disclosure.
Figure 13:
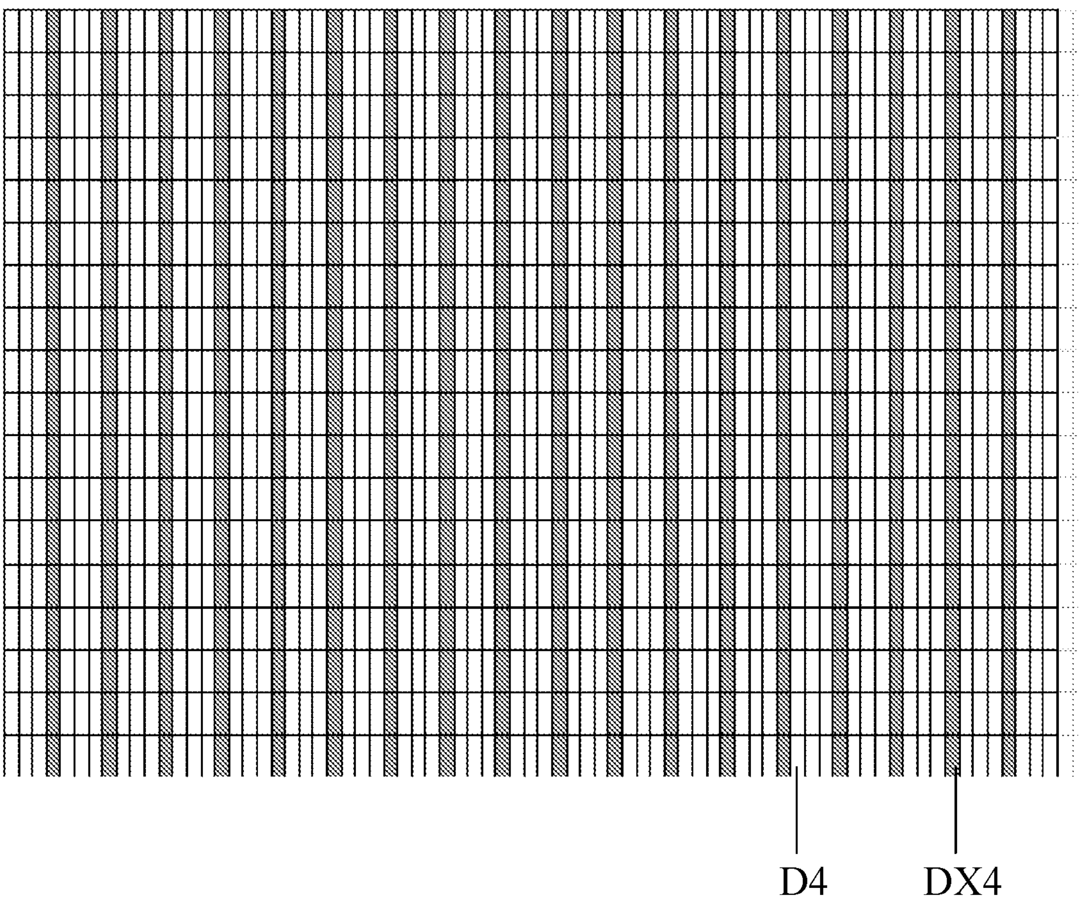
FIG. 13 is a schematic plan view of pixel driving circuits in a third display region of a display substrate provided by at least one embodiment of the present disclosure.

For example, FIG. 12 illustrates a schematic plan view of a plurality of third sub-pixels in the second display region. As illustrated in FIG. 13, the plurality of third sub-pixels include a plurality of third red sub-pixels R3, a plurality of third green sub-pixels G3 and a plurality of third blue sub-pixels B3. In the third red sub-pixel R3, the third light-emitting device includes a third red electrode pattern RP3 electrically connected to the third pixel driving circuit; in the third green sub-pixel G3, the third light-emitting device includes a third green electrode pattern GP3 electrically connected to the third pixel driving circuit; and in the third blue sub-pixel B3, the third light-emitting device includes a third blue electrode pattern BP3 electrically connected to the third pixel driving circuit. For example, the shape of the third red electrode pattern RP3 is basically the same as the shape of the second red electrode pattern RP2, the shape of the third green electrode pattern GP3 is basically the same as the shape of the second green electrode pattern GP2, and the shape of the third blue electrode pattern BP3 is basically the same as the shape of the second blue electrode pattern BP2. Thus, the second display region 20 and the first display region 10 have a more uniform display effect as a whole.

For example, as illustrated in FIG. 10, the first green dummy pixel driving circuit DX1 is in a corner region of the first circuit region 21, for example, two corners of the rectangle, except the semicircle, of the first circuit region 21; the first red dummy pixel driving circuit DX2 is in a corner region of the second circuit region 22, for example, two corners of the rectangle, except the semicircle, of the second circuit region 22; and the first blue dummy pixel driving circuit DX3 is in a corner region of the third circuit region 23, for example, two corners of the rectangle, except the semicircle, of the third circuit region 23.

For example, in some embodiments, the plurality of first dummy transparent wires LX1 are in the same layer as the plurality of first transparent wires L1, the plurality of second dummy transparent wires LX2 are in the same layer as the plurality of second transparent wires, and the plurality of third dummy transparent wires LX3 are in the same layer as the plurality of third transparent wires L3. Thus, the manufacturing process of the display substrate can be simplified, and the structure of the dummy transparent wire and the transparent wire can be more uniform. For example, the dummy transparent wire and the transparent wire are easier to form a basically uniform line width and line spacing during the manufacturing process, so as to make the structure of the dummy transparent wire and the transparent wire more uniform, thus improving the display uniformity of the display substrate.

It should be noted that, in the embodiments of the present disclosure, "in the(a) same layer" means that two functional layers or structural layers are formed in the same layer and with the same material in the hierarchical structure of the display substrate, that is, in the manufacturing process, the two functional layers or structural layers can be formed from the same material layer, and the required pattern and structure can be formed through the same patterning process.

For example, in some embodiments, the materials of the plurality of first transparent wires L1, the plurality of second transparent wires L2 and the plurality of third transparent wires L3 include transparent metal oxides, such as indium tin oxide (ITO), etc. Correspondingly, the materials of the plurality of first dummy transparent wire LX1, the plurality of second dummy transparent wire LX2 and the plurality of third dummy transparent wire LX3 also include transparent metal oxides, such as indium tin oxide (ITO), etc.

For example, in some embodiments, as illustrated in FIG. 4, the display region includes two second display regions 20, and the two second display regions 20 are respectively on opposite sides of the first display region 10, and are symmetrical with respect to the first display region 10. That is, the two second display regions 20 have basically the same structure, and the structures of the two second display regions 20 are symmetrical with respect to the first display region 10.

For example, in some embodiments, as illustrated in FIG. 3, the display region further includes a third display region 30 at least partially surrounding the first display region 10 and the second display region 20, and the third display region 30 is the main display region of the display substrate. For example, the third display region 30 includes a plurality of fourth sub-pixels. For example, the structure of the fourth sub-pixel is basically the same as the structure of the third sub-pixel. Referring to FIG. 7, each of the plurality of fourth sub-pixels includes a fourth pixel driving circuit D4 and a fourth light-emitting device E4, and the fourth pixel driving circuit D4 is configured to drive the fourth light-emitting device E4. The fourth pixel driving circuit D4 is on the base substrate, the fourth light-emitting device E4 is on a side of the fourth pixel driving circuit D4 away from the base substrate, and in the direction perpendicular to the base substrate, the fourth light-emitting device E4 at least partially overlaps with the fourth pixel driving circuit D4, so that the fourth sub-pixel also adopts the mode of "in-situ driving".

For example, the third display region 30 may further include a plurality of second dummy pixel driving circuits, and the plurality of second dummy pixel driving circuits are dispersed in the plurality of fourth pixel driving circuits. For example, FIG. 13 illustrates a schematic layout diagram of the plurality of fourth pixel driving circuits and the plurality of second dummy pixel driving circuits in the third display region 30. As illustrated in FIG. 13, the plurality of second dummy pixel driving circuits DX4 are arranged in a plurality of columns, three columns of fourth pixel driving circuits D4 are provided between every two adjacent columns of second dummy pixel driving circuits DX4, and the three columns of fourth pixel driving circuits D4 respectively drive fourth sub-pixels of different colors (such as red, green and blue). For example, the second dummy pixel driving circuits are not used to drive the light-emitting devices, and the arrangement of the second dummy pixel driving circuits helps to uniformly form each pixel driving circuit in the second display region and the third display region during the manufacturing process, thereby facilitating the display uniformity of the entire display substrate.

It should be noted that, in the embodiments of the present disclosure, the display substrate may be a flexible display substrate, in this case, the base substrate 110 may be a flexible substrate such as polyimide (PI); or, the display substrate may also be a rigid substrate, in this case, the base substrate 110 may be a rigid substrate such as glass or quartz.

For example, in some embodiments, the base substrate 110 may further be provided with functional layers such as a barrier layer and a buffer layer, which are not illustrated in the figure. For example, the materials of the gate electrode, the first capacitor plate and the second capacitor plate may include metals such as aluminum, titanium, copper, cobalt, etc., or alloy materials, and may be formed as a single-layer metal structure or a multi-layer metal structure, such as titanium/aluminum/titanium, molybdenum/aluminum/molybdenum, titanium/copper/titanium or molybdenum/copper/molybdenum and other three-layer metal structure. The active layer may be made of materials such as polysilicon and metal oxide, etc., and the gate insulating layer and the interlayer insulating layer may be made of inorganic insulating materials such as silicon oxide, silicon nitride or silicon oxynitride.

For example, the materials of the pixel defining layer and the organic encapsulation layer may be made of organic insulating materials such as polyimide and epoxy resin, etc., and the inorganic encapsulation layer may be made of an inorganic insulating material such as silicon oxide, silicon nitride or silicon oxynitride, etc.

For example, the material of the electrode pattern as the anode may include metal oxides such as ITO, IZO, etc., or metals such as Ag, Al, Mo, etc., or alloys thereof. The material of the organic light-emitting layer in the light-emitting material layer may be selected as a light-emitting material that can emit light of a certain color (such as red light, blue light or green light, etc.) according to requirements. In addition, the light-emitting material layer may further include auxiliary light-emitting layers such as a hole transport layer, a hole injection layer, an electron transport layer and an electron injection layer. The material of the electrode as the cathode may include metals such as Mg, Ca, Li or Al, or alloys thereof, or metal oxides such as IZO and ZTO, etc., or organic materials with conductive properties such as PEDOT/PSS (poly 3,4-ethylenedioxythiophene/polystyrene sulfonate), etc. The embodiments of the present disclosure do not limit the material of each functional layer, and the material of each functional layer is not limited to the above examples.

At least one embodiment of the present disclosure further provides a display device, which includes the display substrate provided by the embodiments of the present disclosure and a sensor. For example, referring to FIG. 6, the sensor SS is on the non-display side of the display substrate, and the orthographic projection of the sensor SS on the base substrate 110 at least partially overlaps with the first display region 10, such as the first sub-region 11, and the sensor SS is configured to receive light from the display side of the display substrate for normal operation of the sensor SS. For example, the sensor SS may be a device such as a camera or an infrared sensor, etc., and can realize multiple functions such as taking pictures, face recognition, and infrared sensing through the first display region 10.

For example, the display device may be any product or component with a display function, such as a mobile phone, a tablet computer, a television, a monitor, a notebook computer, a digital photo frame, a navigator, or the like, which is not limited in the embodiments of the present disclosure.

The following statements should be noted:

(1) The drawings involve only the structure(s) in connection with the embodiment(s) of the present disclosure, and other structure(s) can be referred to common design(s).

(2) For clarity, in the drawings used to describe the embodiments of the present disclosure, the thicknesses of layers or regions are enlarged or reduced, that is, the drawings are not drawn to actual scale. It can be understood that when a component such as a layer, film, region or substrate is referred to as being "on" or "under" another component, the component may be "directly" "on" or "under" another component, or one or more intermediate components may be interposed therebetween.

(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A display substrate, comprising:

a display region, comprising a first display region and a second display region on at least one side of the first display region, wherein the first display region is at least partially light-transmissive;

the first display region comprises a first sub-region, the first sub-region comprises a plurality of first sub-pixels arranged in an array, and each of the plurality of first sub-pixels comprises a first light-emitting device;

the second display region comprises a first circuit region on a side of the first display region, a second circuit region on a side of the first circuit region away from the first display region, and a third circuit region on a side of the second circuit region away from the first display region;

the plurality of first sub-pixels comprise a plurality of first red sub-pixels, a plurality of first green sub-pixels and a plurality of first blue sub-pixels;

the first circuit region comprises a plurality of first green pixel driving circuits, the second circuit region comprises a plurality of first red pixel driving circuits, and the third circuit region comprises a plurality of first blue pixel driving circuits; and a plurality of first light-emitting devices of the plurality of first red sub-pixels are electrically connected to the plurality of first red pixel driving circuits respectively through a plurality of first transparent wires, a plurality of first light-emitting devices of the plurality of first green sub-pixels are electrically connected to the plurality of first green pixel driving circuits respectively through a plurality of second transparent wires, and a plurality of first light-emitting devices of the plurality of first blue sub-pixels are electrically connected to the plurality of first blue pixel driving circuits respectively through a plurality of third transparent wires;

the plurality of first light-emitting devices of the plurality of first red sub-pixels being electrically connected to the plurality of first red pixel driving circuits respectively through the plurality of first transparent wires comprises:

each row of pixel units comprises an (N)th pixel unit and an (N+1)th pixel unit adjacent to each other, and a first red sub-pixel in the (N)th pixel unit is closer to the second circuit region than a first red sub-pixel in the (N+1)th pixel unit;

the second circuit region comprises an (N)th first red pixel driving circuit and an (N+1)th first red pixel driving circuit arranged in a same row and adjacent to each other, and the (N)th first red pixel driving circuit is closer to the first display region than the (N+1)th first red pixel driving circuit;

the (N)th first red pixel driving circuit is connected to a first light-emitting device of the first red sub-pixel in the (N)th pixel unit through one first transparent wire, and the (N+1)th first red pixel driving circuit is connected to a first light-emitting device of the first red sub-pixel in the (N+1)th pixel unit through one first transparent wire; and N is a positive integer greater than or equal to 1.

2. The display substrate according to claim 1, further comprising a base substrate, wherein the plurality of first transparent wires are on the base substrate and in a same layer, the plurality of second transparent wires are in a same layer and on a side of the plurality of first transparent wires away from the base substrate, and the plurality of third transparent wires are in a same layer and on a side of the plurality of second transparent wires away from the base substrate.

3. The display substrate according to claim 2, wherein the first red pixel driving circuit comprises a thin film transistor and a storage capacitor, and a first light-emitting device of the first red sub-pixel comprises a first red electrode pattern electrically connected to the first red pixel driving circuit;

the thin film transistor comprises an active layer, a gate electrode, and source-drain electrodes; the storage capacitor comprises a first capacitor plate and a second capacitor plate;

the active layer is on the base substrate;

the gate electrode and the first capacitor plate are in a same layer and on a side of the active layer away from the base substrate;

the second capacitor plate is on a side of the gate electrode and the first capacitor plate away from the base substrate;

the source-drain electrodes are on a side of the second capacitor plate away from the base substrate; and in a direction perpendicular to the base substrate, the plurality of first transparent wires, the plurality of second transparent wires and the plurality of third transparent wires are between the source-drain electrodes and the first red electrode pattern.

4. The display substrate according to claim 1, wherein the plurality of first sub-pixels are arranged in a plurality of rows and columns, and form a plurality of pixel units arranged periodically, and each pixel unit of the plurality of pixel units comprises one first red sub-pixel, one first green sub-pixel and one first blue sub-pixel;

in each pixel unit, first light-emitting devices of the first red sub-pixel and the first green sub-pixel are in a same column, and a first light-emitting device of the first blue sub-pixel is in a column adjacent to the same column.

5. The display substrate according to claim 4, wherein a first transparent wire, a second transparent wire and a third transparent wire, respectively connected to a first light-emitting device of a first red sub-pixel, a first light-emitting device of a first green sub-pixel and a first light-emitting device of a first blue sub-pixel which are in a same pixel unit, at least partially overlap with each other in a direction perpendicular to the base substrate.

6. The display substrate according to claim 4, wherein the plurality of pixel units are arranged in a plurality of rows and columns, each row of pixel units comprises 18 pixel units, each of the 18 pixel units is electrically connected to a group of transparent wires, and the group of transparent wires comprises one first transparent wire, one second transparent wire and one third transparent wire; and the 18 pixel units comprise 54 first sub-pixels, and the 54 first sub-pixels are electrically connected to 18 groups of transparent wires, respectively.

7. The display substrate according to claim 1, wherein in a direction from an edge of the first display region close to the second display region to a center of the first display region, extension lengths of the plurality of first transparent wires along a column direction increase gradually.

8. The display substrate according to claim 1, wherein the plurality of first light-emitting devices of the plurality of first green sub-pixels being electrically connected to the plurality of first green pixel driving circuits respectively through the plurality of second transparent wires comprises:

each row of pixel units comprises an (N)th pixel unit and an (N+1)th pixel unit adjacent to each other, and a first green sub-pixel in the (N)th pixel unit is closer to the first circuit region than a first green sub-pixel in the (N+1)th pixel unit;

the first circuit region comprises an (N)th first green pixel driving circuit and an (N+1)th first green pixel driving circuit arranged in a same row, and the (N)th first green pixel driving circuit is closer to the first display region than the (N+1)th first green pixel driving circuit;

the (N)th first green pixel driving circuit is connected to a first light-emitting device of the first green sub-pixel in the (N)th pixel unit through one second transparent wire, and the (N+1)th first green pixel driving circuit is connected to a first light-emitting device of the first green sub-pixel in the (N+1)th pixel unit through one second transparent wire; and N is a positive integer greater than or equal to 1.

9. The display substrate according to claim 1, wherein the plurality of first light-emitting devices of the plurality of first blue sub-pixels being electrically connected to the plurality of first blue pixel driving circuits respectively through the plurality of third transparent wires comprises:

each row of pixel units comprises an (N)th pixel unit and an (N+1)th pixel unit adjacent to each other, and a first blue sub-pixel in the (N)th pixel unit is closer to the third circuit region than a first blue sub-pixel in the (N+1)th pixel unit;

the third circuit region comprises an (N)th first blue pixel driving circuit and an (N+1)th first blue pixel driving circuit arranged in a same row, and the (N)th first blue pixel driving circuit is closer to the first display region than the (N+1)th first blue pixel driving circuit;

the (N)th first blue pixel driving circuit is connected to a first light-emitting device of the first blue sub-pixel in the (N)th pixel unit through one third transparent wire, and the (N+1)th first blue pixel driving circuit is connected to a first light-emitting device of the first blue sub-pixel in the (N+1)th pixel unit through one third transparent wire; and N is a positive integer greater than or equal to 1.

10. The display substrate according to claim 1, wherein the first display region is basically square, the first sub-region is basically circular, the first sub-region is in a middle portion of the first display region, and second sub-regions are at four corners of the first display region.

11. The display substrate according to claim 1, wherein the display region comprises two second display regions, and the two second display regions are respectively on opposite sides of the first display region, and are symmetrical with respect to the first display region.

12. The display substrate according to claim 11, wherein the display region further comprises a third display region at least partially surrounding the first display region and the second display region, the third display region comprises a plurality of fourth sub-pixels, each of the plurality of fourth sub-pixels comprises a fourth pixel driving circuit and a fourth light-emitting device, and the fourth pixel driving circuit is configured to drive the fourth light-emitting device;

the fourth pixel driving circuit is on the base substrate, the fourth light-emitting device is on a side of the fourth pixel driving circuit away from the base substrate, and in a direction perpendicular to the base substrate, the fourth light-emitting device at least partially overlaps with the fourth pixel driving circuit; and the third display region further comprises a plurality of second dummy pixel driving circuits, and the plurality of second dummy pixel driving circuits are dispersed in a plurality of fourth pixel driving circuits;

the plurality of second dummy pixel driving circuits are arranged in a plurality of columns, and three columns of fourth pixel driving circuits are between every two adjacent columns of second dummy pixel driving circuits.

13. A display device, comprising:

the display substrate according to claim 1, and a sensor, on a non-display side of the display substrate, wherein in a direction perpendicular to the base substrate, the sensor overlaps with the first display region, and the sensor is configured to receive light from a display side of the display substrate.

14. A display substrate, comprising:

a display region, comprising a first display region and a second display region on at least one side of the first display region, wherein the first display region is at least partially light-transmissive;

the first display region comprises a first sub-region, the first sub-region comprises a plurality of first sub-pixels arranged in an array, and each of the plurality of first sub-pixels comprises a first light-emitting device;

the second display region comprises a first circuit region on a side of the first display region, a second circuit region on a side of the first circuit region away from the first display region, and a third circuit region on a side of the second circuit region away from the first display region;

the plurality of first sub-pixels comprise a plurality of first red sub-pixels, a plurality of first green sub-pixels and a plurality of first blue sub-pixels;

the first circuit region comprises a plurality of first green pixel driving circuits, the second circuit region comprises a plurality of first red pixel driving circuits, and the third circuit region comprises a plurality of first blue pixel driving circuits; and a plurality of first light-emitting devices of the plurality of first red sub-pixels are electrically connected to the plurality of first red pixel driving circuits respectively through a plurality of first transparent wires, a plurality of first light-emitting devices of the plurality of first green sub-pixels are electrically connected to the plurality of first green pixel driving circuits respectively through a plurality of second transparent wires, and a plurality of first light-emitting devices of the plurality of first blue sub-pixels are electrically connected to the plurality of first blue pixel driving circuits respectively through a plurality of third transparent wires;

wherein the first display region further comprises a second sub-region at least partially surrounding the first sub-region, the second sub-region comprises a plurality of second sub-pixels, each of the plurality of second sub-pixels comprises a second pixel driving circuit and a second light-emitting device, and the second pixel driving circuit is configured to drive the second light-emitting device; and the second pixel driving circuit is on the base substrate, the second light-emitting device is on a side of the second pixel driving circuit away from the base substrate, and in a direction perpendicular to the base substrate, the second light-emitting device at least partially overlaps with the second pixel driving circuit.

15. The display substrate according to claim 14, wherein a first light-emitting device of the first red sub-pixel comprises a first red electrode pattern electrically connected to a first red pixel driving circuit, a first light-emitting device of the first green sub-pixel comprises a first green electrode pattern electrically connected to a first green pixel driving circuit, and a first light-emitting device of the first blue sub-pixel comprises a first blue electrode pattern electrically connected to a first blue pixel driving circuit;

the plurality of second sub-pixels comprise a second red sub-pixel, a second green sub-pixel and a second blue sub-pixel; in the second red sub-pixel, a second light-emitting device comprises a second red electrode pattern electrically connected to a second pixel driving circuit; in the second green sub-pixel, a second light-emitting device comprises a second green electrode pattern electrically connected to a second pixel driving circuit; in the second blue sub-pixel, a second light-emitting device comprises a second blue electrode pattern electrically connected to a second pixel driving circuit; and an area of the first red electrode pattern is smaller than an area of the second red electrode pattern, an area of the first green electrode pattern is smaller than an area of the second green electrode pattern, and an area of the first blue electrode pattern is smaller than an area of the second blue electrode pattern.

16. The display substrate according to claim 14, wherein the second display region further comprises a plurality of third sub-pixels, each of the plurality of third sub-pixels comprises a third pixel driving circuit and a third light-emitting device, and the third pixel driving circuit is configured to drive the third light-emitting device;

the third pixel driving circuit is on the base substrate, the third light-emitting device is on a side of the third pixel driving circuit away from the base substrate, and in the direction perpendicular to the base substrate, the third light-emitting device at least partially overlaps with the third pixel driving circuit; and in the second display region, the plurality of third pixel region circuits are arranged in a first array.

17. The display substrate according to claim 16, wherein in the first circuit region of the second display region, the plurality of first green pixel driving circuits are dispersed in the first array, and arranged as a second array with the plurality of third pixel driving circuits;

in the second circuit region of the second display region, the plurality of first red pixel driving circuits are dispersed in the first array, and arranged as a third array with the plurality of third pixel driving circuits; and in the third circuit region of the second display region, the plurality of first blue pixel driving circuits are dispersed in the first array, and arranged as a fourth array with the plurality of third pixel driving circuits.

18. The display substrate according to claim 17, wherein in the first circuit region, three third pixel driving circuits are between every two adjacent first green pixel driving circuits in a same row;

in the second circuit region, three third pixel driving circuits are between every two adjacent first red pixel driving circuits in a same row; and in the third circuit region, three third pixel driving circuits are between every two adjacent first blue pixel driving circuits in a same row.

19. The display substrate according to claim 17, wherein the first circuit region further comprises a plurality of first green dummy pixel driving circuits, the second circuit region further comprises a plurality of second red dummy pixel driving circuits, and the third circuit region further comprises a plurality of second blue dummy pixel driving circuits;

the plurality of second sub-pixels comprise a plurality of second red sub-pixels, a plurality of second green sub-pixels and a plurality of second blue sub-pixels;

the display substrate further comprises a plurality of first dummy transparent wires, a plurality of second dummy transparent wires and a plurality of third dummy transparent wires;

the plurality of first dummy transparent wires respectively extend between the plurality of first red dummy pixel driving circuits and the plurality of second red sub-pixels, and the plurality of first dummy transparent wires are electrically connected to the plurality of first red dummy pixel driving circuits, respectively, but not electrically connected to a plurality of second light-emitting devices of the plurality of second red sub-pixels;

the plurality of second dummy transparent wires respectively extend between the plurality of first green dummy pixel driving circuits and the plurality of second green sub-pixels, and the plurality of second dummy transparent wires are electrically connected to the plurality of first green dummy pixel driving circuits, respectively, but not electrically connected to a plurality of second light-emitting devices of the plurality of second green sub-pixels; and the plurality of third dummy transparent wires respectively extend between the plurality of first blue dummy pixel driving circuits and the plurality of second blue sub-pixels, and the plurality of third dummy transparent wires are electrically connected to the plurality of first blue dummy pixel driving circuits, respectively, but not electrically connected to a plurality of second light-emitting devices of the plurality of second blue sub-pixels.

* * * * *